(12) United States Patent
Ifuku et al.

(10) Patent No.: US 7,521,845 B2
(45) Date of Patent: Apr. 21, 2009

(54) PIEZOELECTRIC SUBSTANCE, PIEZOELECTRIC ELEMENT, LIQUID DISCHARGE HEAD USING PIEZOELECTRIC ELEMENT, AND LIQUID DISCHARGE APPARATUS

(75) Inventors: Toshihiro Ifuku, Yokohama (JP); Takanori Matsuda, Chofu (JP); Katsumi Aoki, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 433 days.

(21) Appl. No.: 11/464,110

(22) Filed: Aug. 11, 2006

(65) Prior Publication Data
US 2007/0046152 A1    Mar. 1, 2007

(30) Foreign Application Priority Data
Aug. 23, 2005   (JP)   ............... 2005-241396

(51) Int. Cl.
H01L 41/08   (2006.01)
B41J 2/45    (2006.01)
C04B 35/49   (2006.01)

(52) U.S. Cl. ............... 310/358; 252/62.9 PZ; 310/324; 310/330; 347/68; 501/134

(58) Field of Classification Search ......... 310/330–332, 310/358, 359, 324; 252/62.9 PZ; 347/68–72; 501/134–136; 264/61
See application file for complete search history.

(56) References Cited

U.S. PATENT DOCUMENTS

| | | | |
|---|---|---|---|
| 6,653,211 B2 | 11/2003 | Unno et al. |
| 6,854,832 B2 | 2/2005 | Matsuda |
| 6,927,084 B2 | 8/2005 | Fukui et al. |
| 7,045,935 B2 | 5/2006 | Matsuda et al. |
| 7,053,526 B2 | 5/2006 | Unno et al. |
| 7,059,711 B2 | 6/2006 | Aoto et al. |
| 7,120,978 B2 | 10/2006 | Wasa et al. |
| 7,144,101 B2 | 12/2006 | Ifuku et al. |
| 2004/0155559 A1 | 8/2004 | Ifuku et al. |
| 2005/0127780 A1 | 6/2005 | Ifuku et al. |
| 2005/0168112 A1 | 8/2005 | Aoki et al. |
| 2005/0189849 A1 | 9/2005 | Ifuku et al. |
| 2005/0219793 A1 | 10/2005 | Matsuda et al. |
| 2006/0033404 A1 | 2/2006 | Fukui et al. |
| 2006/0049135 A1 | 3/2006 | Okabe et al. |

(Continued)

OTHER PUBLICATIONS

"Formation of Pb-based ferroelectric thin film by ion beam sputtering method and research on its functional device application," Osaka University Engineering Theory No. 13557, Feb. 25, 1998, pp. 34-35, and English-language translation thereof.

(Continued)

Primary Examiner—Mark Budd
(74) Attorney, Agent, or Firm—Fitzpatrick, Cella, Harper & Scinto

(57) ABSTRACT

A piezoelectric material, characterized in that a main component of the piezoelectric substance is PZT, which has perovskite type structure expressed in $Pb(Zr_xTi_{1-x})O_3$ (x expresses an element ratio Zr/(Zr+Ti) of Zr and Ti in the formula), an element ratio Pb/(Zr+Ti) of Pb, Zr and Ti of the piezoelectric substance is 1.05 or more, and an element ratio Zr/(Zr+Ti) of Zr and Ti is 0.5 to 0.8 inclusive, and the piezoelectric substance has at least a perovskite type structure of monoclinic system.

10 Claims, 12 Drawing Sheets

U.S. PATENT DOCUMENTS

| | | |
|---|---|---|
| 2007/0046153 A1 | 3/2007 | Matsuda et al. |
| 2007/0046154 A1 | 3/2007 | Ifuku et al. |
| 2007/0046734 A1 | 3/2007 | Aoki et al. |
| 2007/0048190 A1 | 3/2007 | Ifuku et al. |
| 2007/0060467 A1 | 3/2007 | Matsuda et al. |

OTHER PUBLICATIONS

"Fujitsu's Fabrication Technology for 0.5 μm and 0.35 μm FRAM," 53(2) *Fujitsu* 105-109 (2002).

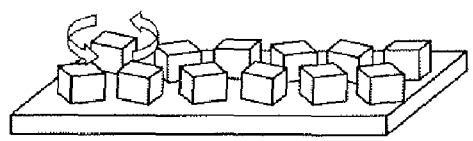
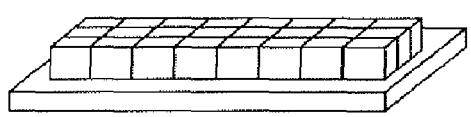
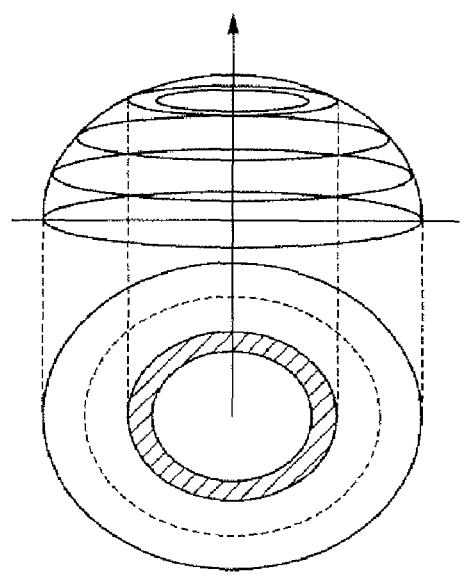
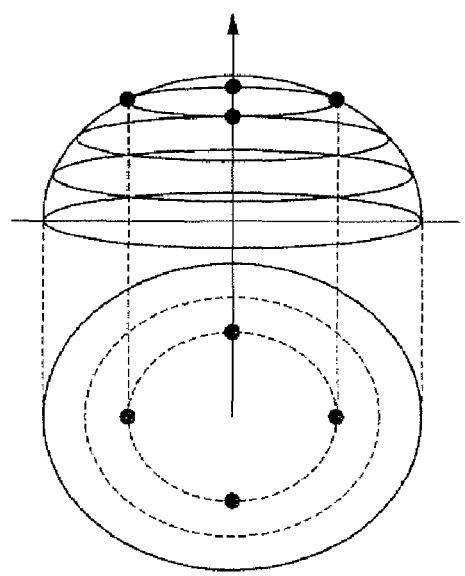
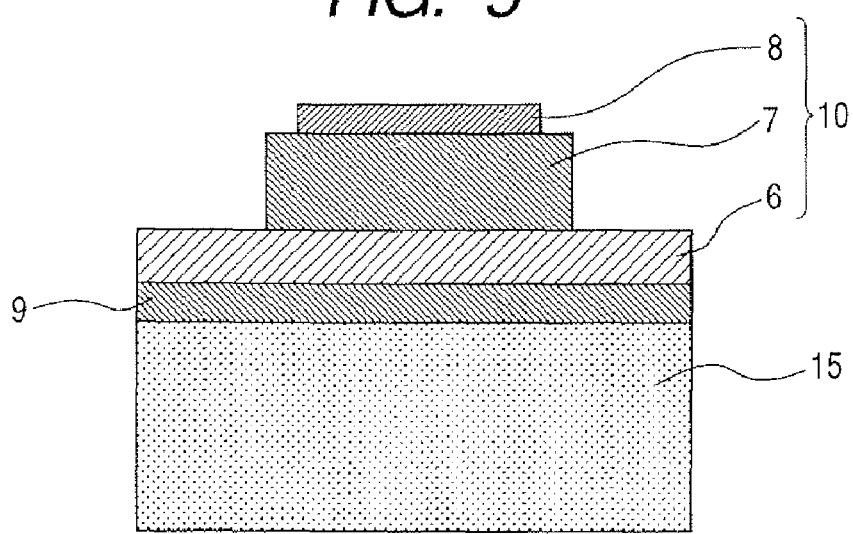

PIEZOELECTRIC SUBSTANCE, PIEZOELECTRIC ELEMENT, LIQUID DISCHARGE HEAD USING PIEZOELECTRIC ELEMENT, AND LIQUID DISCHARGE APPARATUS

BACKGROUND OF THE INVENTION

1. Field of the Invention

The present invention relates to a piezoelectric substance, a piezoelectric element, a liquid discharge head using the same, and a liquid discharge apparatus.

2. Description of the Related Art

In recent years, a piezoelectric actuator has been paid attention to at a point that miniaturization and high densification of a motor is possible, in a portable information device field, chemistry, and a medical field as a new motor which replaces an electromagnetic motor. The piezoelectric actuator does not generate an electromagnetic noise on the occasion of its drive, and, is not influenced by noise. Furthermore, the piezoelectric actuator attracts attention as technology of making such equipment with millimeter class size that is represented by a micromachine, and a minute piezoelectric element is requested as its drive source.

As for a piezoelectric element, generally, it is common to finely form and produce a sintered compact of a bulk material or a single crystal member, which is given heat-treatment to a piezoelectric substance, in desired size and thickness with technology such as machining and polishing. In addition, when forming a minute piezoelectric element, a method of directly forming a piezoelectric element by coating and sintering a green sheet-like piezoelectric substance by using methods, such as a printing method, in a predetermined position on a substrate, such as metal or silicon is common. A thickness of such a compact from a green sheet is tens to hundreds of micrometers, electrodes are provided in upper and lower sides of the piezoelectric substance, and a voltage is applied through the electrodes.

Heretofore, a small piezoelectric element which was used for a liquid discharge head was produced by finely forming a piezoelectric substance in a bulk material with technology such as machining or polishing as mentioned above, or using a green sheet-like piezoelectric substance. As a device using such a piezoelectric element, for example, there is a liquid discharge head which has unimorph type piezoelectric element structure. The liquid discharge head is equipped with a pressure chamber communicating with an ink feed chamber, and an ink ejection orifice communicating with the pressure chamber, and a vibrating plate with which the piezoelectric element is bonded or in which it is formed directly is provided and constructed in the pressure chamber. In such construction, an ink droplet is discharged from the ink discharge port by compressing the ink in the pressure chamber by generating deflection vibration, which is caused by expanding and contracting the piezoelectric element by applying a predetermined voltage to the piezoelectric element.

Although color ink jet printers have spread presently by using such an operation, enhancement in their printing performance, and in particular, higher resolution, and high speed printing are requested. Therefore, it has been attempted to attain high resolution and high speed printing using multi-nozzle head structure in which a liquid discharge head has been miniaturized. In order to miniaturize a liquid discharge head, it is necessary to miniaturize further a piezoelectric element for discharging ink. Furthermore, recently, attempts of applying liquid discharge heads to industrial applications such as straight-writing of wiring have been also active. At that time, it is necessary to pattern liquid with more various characteristics at higher resolution, and hence, further high performance of a liquid discharge head is requested.

In recent years, because of development of micromachine technology, researches of developing a highly precise micro piezoelectric element by forming a piezoelectric substance as a thin film, and using fine processing technology having been used in semiconductors have been performed. In particular, a thickness of a piezoelectric substance formed by film methods, such as a sputtering method, a chemical vapor deposition method, a sol gel method, and a gas deposition method is generally hundreds of nanometers to tens of micrometers in the case of an application to a piezoelectric actuator. Electrodes are provided on the piezoelectric substance and a voltage is applied through the electrodes.

On the other hand, research of high performance piezoelectric materials, having greater piezoelectric property, in connection with miniaturization of a piezoelectric element is also active. As a piezoelectric material which has attracted attention recently, there is a ferroelectric material which has the perovskite type structure which is constructed in a general formula $ABO_3$. This material exerts excellent ferroelectricity, pyroelectricity, and piezoelectricity as represented, for example, by $Pb(Zr_xTi_{1-x})O_3$ (lead zirconate titanate: PZT).

When a piezoelectric element made of PZT is generally formed by a film method, such as a sputtering method, a chemical vapor deposition method, a sol gel method, or a gas deposition method, a thin film obtained takes the perovskite type structure which is constructed in the general formula $ABO_3$. When the element ratio Pb/(Zr+Ti) of Pb, Zr and Ti is equal to or less than 1, which is a stoichiometric ratio of the perovskite type structure which is constructed in the general formula $ABO_3$, piezoelectricity drops rapidly. For this reason, when forming the piezoelectric element made of PZT, Pb may be added a little more excessively than the stoichiometric ratio, and in particular, the sputtering method has that tendency remarkably. Nevertheless, when Pb is added further in excess of the stoichiometric ratio, generally a leakage current at the time of voltage application increases. For this reason, it was necessary to decide an optimum Pb excessive dosage with an effect of increase of leakage current, and piezoelectricity as trade-off relation. (Non-Patent Document 1: FUJITSU.53, 2, p. 105-109 (March, 2002)).

The present invention aims at providing a piezoelectric substance which solves the above-mentioned problems, has large piezoelectricity, and uses PZT, which can suppress a leakage current at the time of voltage application which becomes a problem at the time of lead excessive addition, as a main component, and a piezoelectric element using this. In addition, the present invention aims at providing a liquid discharge head, which exerts uniform and high discharging performance and can perform fine patterning, and a liquid discharge apparatus having this.

SUMMARY OF THE INVENTION

The above-mentioned objects are achieved by a piezoelectric substance, characterized in that a main component of the piezoelectric substance is PZT, which has a perovskite type structure expressed in $Pb(Zr_xTi_{1-x})O_3$ (x expresses an element ratio Zr/(Zr+Ti) of Zr and Ti in the formula), an element ratio Pb/(Zr+Ti) of Pb, Zr and Ti of the piezoelectric substance is 1.05 or more, and an element ratio Zr/(Zr+Ti) of Zr and Ti is 0.5 to 0.8 inclusive, and the piezoelectric substance has at least a perovskite type structure of a monoclinic system.

The present invention can provide a piezoelectric substance which has large piezoelectricity, and uses PZT, which can suppress a leakage current at the time of voltage application which becomes a problem at the time of lead excessive addition, as a main component, and a piezoelectric element using this.

Furthermore, using the above-mentioned piezoelectric element makes it possible to obtain a liquid discharge head, which exerts uniform and high discharging performance and can perform fine patterning, and a liquid discharge apparatus having this.

Further features of the present invention will become apparent from the following description of exemplary embodiments with reference to the attached drawings.

BRIEF DESCRIPTION OF THE DRAWINGS

FIG. 3 is a schematic diagram of an example of a uniaxial crystal in this embodiment, and a schematic dot diagram of positive electrode by X-ray diffraction thereof.

FIG. 4 is a schematic diagram of an example of a single crystal in this embodiment, and a schematic positive peak diagram by X-ray diffraction thereof.

FIG. 5 is a schematic diagram showing an example of an embodiment of a piezoelectric element of this embodiment.

DESCRIPTION OF THE EMBODIMENTS

The following description is with regards to a mechanism that uses the piezoelectric element (piezoelectric thin film element) of the present invention and can achieve excellent features.

At the time of forming a PZT piezoelectric substance by a film method or heat sintering after forming a PZT piezoelectric substance, an A site defect of the perovskite type structure which is constructed in $ABO_3$, i.e., a defect of Pb arises, which becomes a major factor which significantly obstructs piezoelectricity. Generally, for example, when a PZT piezoelectric substance is formed by the film methods such as a sputtering method, an element ratio Pb/(Zr+Ti) of Pb, Zr and Ti of the piezoelectric substance obtained becomes more than 1 which is a stoichiometric ratio of the perovskite type structure which is constructed in the general formula $ABO_3$. This is conceivable that Pb in excess of the stoichiometric ratio is needed in order to make this defect not occur. Nevertheless, in this case, since Pb is not altogether taken into A sites originally even if Pb is added considerably excessively, excessive Pb which is not taken into the A sites in the piezoelectric substance acts as leakage sites. Hence, a leakage current is increased.

Figure 1:
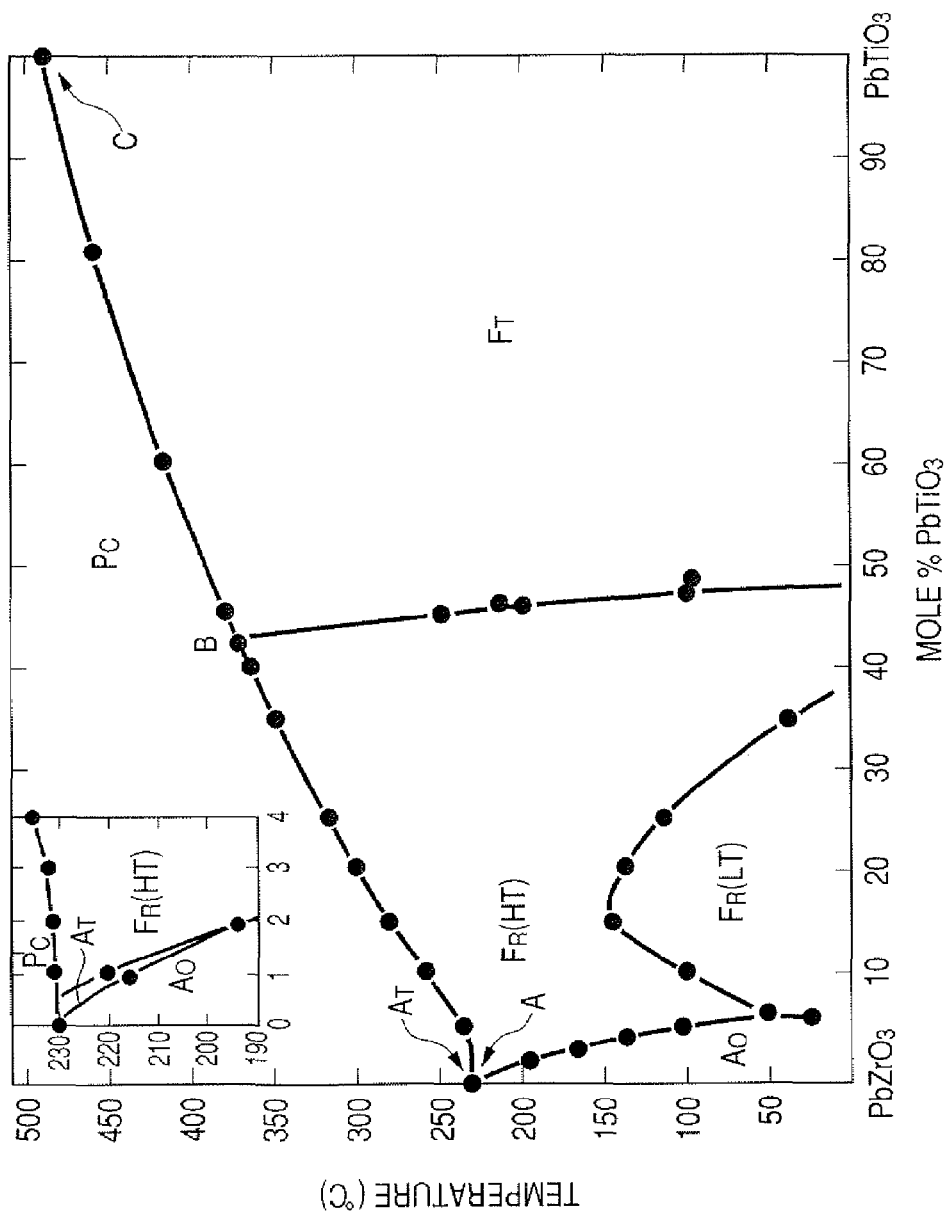
FIG. 1 is a phase diagram of bulk PZT.

FIG. 1 is a phase diagram of bulk PZT which is cited and shown from the document of Isaku Jinno, "Formation of Pb-based ferroelectric thin film by ion beam sputtering method and research on its functional device application", Osaka University Engineering Theory No. 13557, Feb. 25, 1998, p. 35, FIG. 3-1(a).

A piezoelectric substance in a bulk in this specification points to a product by a sintering method or a pressure sintering method which is generally used as a production method of ceramics. In addition, a piezoelectric substance which is obtained using a green sheet which is sintered after heat removal of a binder is also regarded as a bulk body in a wide sense.

As shown in FIG. 1, PZT having the perovskite type structure which is constructed in $ABO_3$ has a crystal structure of a tetragonal (region "$F_T$") when Zr/(Zr+Ti) according to the element ratio of Zr and Ti is less than 0.53 at a room temperature in the case of a bulk phase. In addition, PZT has a crystal structure of a rhombohedral (region "$F_R(LT)$") and "$F_R(HT)$") when Zr/(Zr+Ti) is 0.53 or more. Nevertheless, in the case that a piezoelectric substance has at least the perovskite type structure of a monoclinic system when the element ratio Zr/(Zr+Ti) of Zr and Ti is 0.5 to 0.8 inclusive, the following phenomenon is conceivable. That is, even if the element ratio Pb/(Zr+Ti) of Pb, Zr, and Ti of the piezoelectric substance is 1.05 or more, excessive Pb does not act as leakage sites, and a leakage current does not increase. Hence, it becomes possible to make Pb contained more excessively. Consequently, A site defects of Pb decrease further and piezoelectricity improves, and so on, for example.

Further, PZT having the perovskite type structure which is constructed in $ABO_3$ has a Curie temperature $Tc_0$ of 230° C. to 490° C. by the element ratio of Zr and Ti in bulk. However, in the case where the element ratio Zr/(Zr+Ti) of Zr and Ti is 0.5 to 0.8 inclusive, the piezoelectric substance has at least a perovskite type structure of a monoclinic system and a Curie temperature Tc of the piezoelectric substance and a Curie temperature $Tc_0$ in bulk at the element ratio of Zr and Ti of the piezoelectric substance satisfy the relation of $Tc>Tc0+50°$ C., and the following phenomenon is conceivable. That is, even if the element ratio Pb/(Zr+Ti) of Pb, Zr and Ti of the piezoelectric substance is 1.05 or more, excessive Pb does not act as leakage sites, and a leakage current does not increase. Hence, it becomes possible to make Pb contained more excessively. Consequently, A site defects of Pb decrease further and piezoelectricity improves, and so on, for example. Increase of Tc of the piezoelectric substance of the present application embodiment is in a state that this excessive Pb does not act as leakage sites.

Embodiments of the present invention are described with reference to the drawings.

FIG. 5 shows a schematic sectional drawing of an example of an embodiment of a piezoelectric element of the present invention. A piezoelectric element 10 of the present invention is a piezoelectric element including at least a first electrode film 6, a piezoelectric substance 7 which relates to the present invention, and a second electrode film 8. In the piezoelectric element of the embodiment shown in FIG. 5, although a sectional shape of the piezoelectric element 10 is in a rectangle, it may be also a trapezoid or an inverted trapezoid. Although the piezoelectric element 10 of the present application embodiment is formed on a substrate 5, a first electrode film 6 and a second electrode film 8, which construct the piezoelectric element 10 of the present application embodiment may be a lower electrode and an upper electrode respectively, and vice versa. This reason is based on a production method at the time of making the device, and either can obtain the effect of the present invention. In addition, there may be a buffer layer 9 between the substrate 5 and first electrode film 6.

It is possible to produce the piezoelectric element 10 of the present application embodiment by forming the first electrode film 6 on at least the substrate 5 or the buffer layer 9 formed on the substrate 5, next forming the piezoelectric substance 7 thereon, and further forming the second electrode 8.

A main component of the piezoelectric substance 7 of the present application embodiment is lead zirconate titanate (PZT) which has a perovskite type structure expressed in $Pb(Zr_xTi_{1-x})O_3$ (x denotes the element ratio Zr/(Zr+Ti) of Zr and Ti in the formula). The element ratio Pb/(Zr+Ti) of Pb, Zr and Ti is 1.05 or more which is larger than 1, which is the stoichiometric ratio of the perovskite type structure. Further, the element ratio Zr/(Zr+Ti) of Zr and Ti is 0.5 to 0.8 inclusive. In addition, the piezoelectric substance 7 has at least a perovskite type structure of a monoclinic system.

The reason why the element ratio Pb/(Zr+Ti) of Pb, Zr and Ti is made 1.05 or more is because piezoelectricity drops when Pb/(Zr+Ti) approaches 1 which is the stoichiometric ratio, and in particular, piezoelectricity drops rapidly when Pb/(Zr+Ti) is 1 or less. When Pb is added further in excess of the stoichiometric ratio, generally a leakage current at the time of voltage application increases. Although there is a tendency that its effect becomes remarkable in particular when Pb/(Zr+Ti) is 1.2 or more especially, a leakage current is suppressed even if the piezoelectric substance 7 of the piezoelectric element 10 of the present application embodiment is made further excessive. Nevertheless, since it becomes difficult to produce a piezoelectric substance which has the perovskite type structure when it becomes too excessive, it is preferable to make Pb/(Zr+Ti) about 1.5 or less, usually.

In addition, a piezoelectric substance in bulk whose main component is PZT, which has the perovskite type structure which is constructed in the general formula $ABO_3$, generally has crystal systems which are different depending on a temperature and the element ratio of Zr and Ti, as shown in FIG. 1. For example, as shown in FIG. 1, the piezoelectric substance becomes respective crystal phases of a cubic (region "$P_c$"), a tetragonal (region "$F_T$"), a rhombohedral (region "$F_R(HT)$" and "$F_R(LT)$"), and an orthorhombic (region "$A_T$"). In addition to this, a crystal phase of the piezoelectric substance 7 of this embodiment is a monoclinic. Here, the monoclinic in this embodiment means a crystal phase whose lattice constants of a unit lattice are $\beta \neq 90°$, $\alpha = \gamma = 90°$. Although $\alpha = \beta$ or $\alpha \neq \beta$ is also sufficient, generally $\alpha$ and $\beta$ are near values. In addition, for example, although a plurality of crystal phases, such as a monoclinic and a tetragonal, a monoclinic and a rhombohedral, a monoclinic and a tetragonal and a rhombohedral, and other crystal phases, may be intermingled, a monoclinic or a mixed phase of a monoclinic and a crystal phase except a monoclinic is preferable. The element ratio Zr/(Zr+Ti) of Zr and Ti of the piezoelectric substance 7 of this embodiment is 0.5 to 0.8 inclusive, and this is because it is difficult to obtain a monoclinic when the element ratio Zr/(Zr+Ti) is less than 0.5, and it is difficult to produce a film which has the perovskite type structure when exceeding 0.8.

In addition, a PZT piezoelectric substance having the perovskite type structure which is constructed in the general formula $ABO_3$ has a Curie temperature $Tc_0$ of 230° C. to 490° C. by the element ratio of Zr and Ti generally in bulk as shown by the curve ABC in FIG. 1. In the present embodiment, the Curie temperature means a critical temperature at which polarization disappears. Generally, many perovskite type ferroelectric crystals have crystal structure that is a tetragonal at a high temperature and cubic at room temperature (rhombohedral or orthorhombic in the case of PZT). Although a perovskite type ferroelectric crystal does not have spontaneous polarization at a high temperature since it is cubic, when a temperature falls, it becomes tetragonal, rhombohedral, or orthorhombic through a phase transition point for spontaneous polarization to occur. This temperature at which phase transition occurs is called the Curie temperature. In a Curie temperature survey of a piezoelectric substance, generally, a temperature at which a dielectric constant shows the maximum near a phase transition point, when a temperature is raised or lowered gradually, is made a Curie temperature. The Curie temperature Tc of the piezoelectric substance of this embodiment was also measured by such a method. When the piezoelectric substance of this embodiment is made the same element ratio as that in bulk, the Curie temperature Tc preferably satisfies the relation of $Tc>Tc_0+50°$ C. In particular, when Tc of the piezoelectric substance satisfies the above-described relation, the element ratio Zr/(Zr+Ti) of Zr and Ti is preferably 0.2 to 0.8 inclusive. This is because piezoelectricity of the film falls when the element ratio Zr/(Zr+Ti) of Zr and Ti is less than 0.2, and it is difficult to produce a piezoelectric substance which has the perovskite type structure when exceeding 0.8. Here, the Curie temperature Tc of the piezoelectric substance of this embodiment is a temperature at which a dielectric constant at 1 kHz of the piezoelectric substance shows the maximum.

Further, it is particularly preferable that the piezoelectric substance of this embodiment is a monoclinic or a mixed phase of a monoclinic and another crystal phase, the relation of $Tc>Tc_0+50°$ C. is satisfied, and the element ratio Zr/(Zr+Ti) of Zr and Ti is 0.5 to 0.8 inclusive. Still further, it is more preferable that the element ratio Zr/(Zr+Ti) of Zr and Ti is 0.5 to 0.6 inclusive. This is because piezoelectricity of such a piezoelectric substance is the highest and a leakage current does not increase in spite of excessive addition of Pb, and hence, while becoming possible to apply a large voltage to the piezoelectric substance, it is possible to obtain a long-life piezoelectric substance.

In addition, the piezoelectric substance of this embodiment may be what is formed from a composition produced by doping a trace amount of element in the above-mentioned main components. For example, it may be a piezoelectric substance formed from something like La-doped PZT: PLZT [(Pb, La)(Z, Ti)$O_3$].

Furthermore, as for a film thickness of the piezoelectric substance of the present invention, it is preferable to be 1 μm to 10 μm inclusive. When a film thickness of the piezoelectric substance is made 1 μm or more, it is possible to obtain the piezoelectric substance with a monoclinic phase easily. In addition, when being made 10 μm or less, it is possible to form the piezoelectric substance easily by a film method such as a sputtering method.

Figure 2:
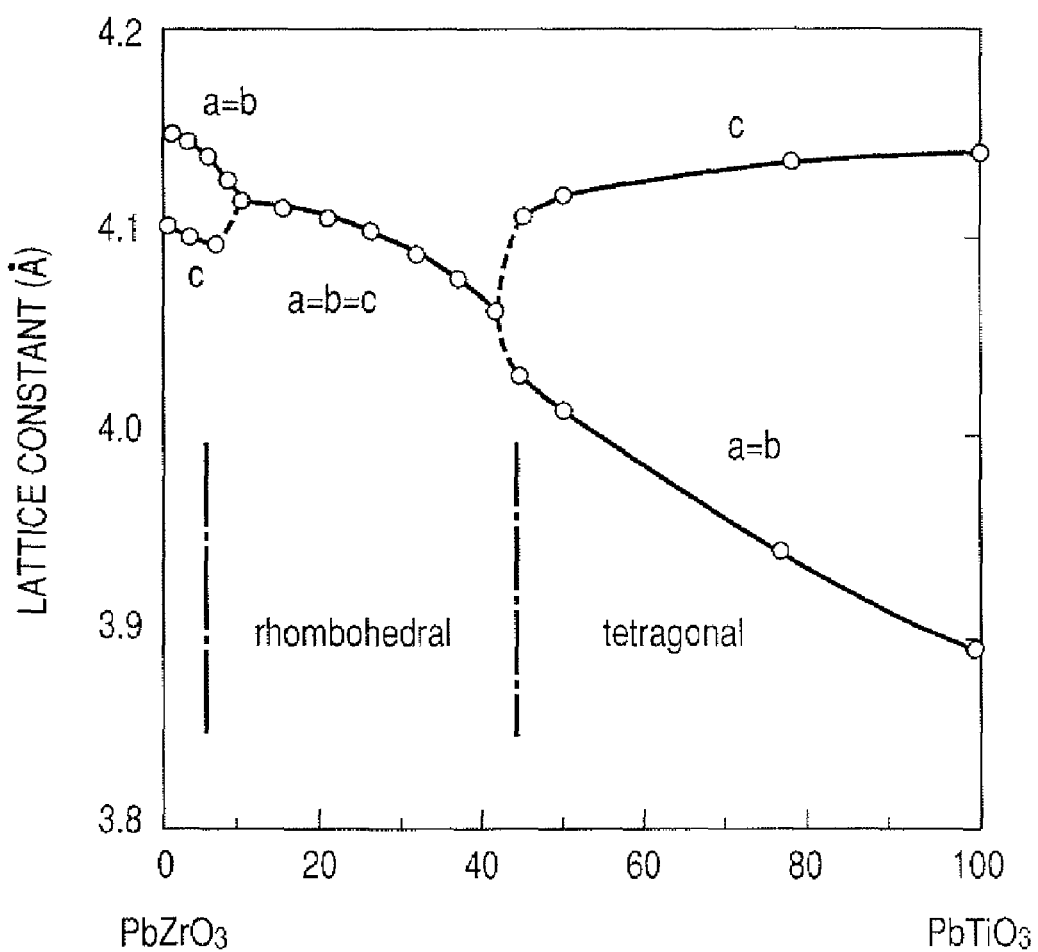
FIG. 2 is a diagram showing a change of a lattice constant by a change of an element ratio of Zr and Ti of bulk PZT.

Moreover, it is preferable that lattice parameters a and c of the piezoelectric substance of this embodiment satisfy the relation of $1.005<c/a<1.05$. FIG. 2 is a diagram which is cited and shown from the document of Isaku Jinno, "Formation of Pb-based ferroelectric thin film by ion beam sputtering method and research on its functional device application", Osaka University Engineering Theory No. 13557, Feb. 25, 1998, p. 35, FIG. 3-1(b). As shown in FIG. 2, as for a PZT piezoelectric substance having the perovskite type structure which is constructed in the general formula $ABO_3$ in a bulk, generally, its lattice constants change according to the element ratio $Zr/(Zr+Ti)$ of Zr and Ti. In addition, it is preferable that the lattice parameters a and c of the piezoelectric substance of this embodiment satisfy the relation of $1.005<c/a<1.05$, and it is more preferable that a lattice constant a and a lattice constant $a_0$ in the bulk in the element ratio of Zr and Ti satisfy the relation of $a \geq a_0$. This is because, when satisfying the above-mentioned relations, a leakage current of the piezoelectric substance is further suppressed. Although this detailed reason is unknown, it is conceivable that the A site defects of Pb mentioned above further decrease, and this change appears in a change of the lattice constants.

In addition, a case where the piezoelectric substance is constructed from a uniaxial crystal or a single crystal is preferable because the piezoelectric substance has larger piezoelectricity, and hence, is preferable. Similarly, a case of being <100> orientation is preferable because the piezoelectric substance has further larger piezoelectricity. At this time, higher <100> orientation of the piezoelectric substance is more preferable, and the case where the piezoelectric substance is constructed from a single crystal and an orientation rate is 100% is most preferable.

Here, the orientation in the present invention means having single crystal orientation in a thickness direction. For example, <100> orientation is that crystal axes in a thickness direction of the piezoelectric substance are aligned in the <100> direction. It is possible to confirm using X-ray diffraction whether the piezoelectric substance of this embodiment has the orientation. For example, an example of the piezoelectric substance with the <100> orientation which is constructed of a piezoelectric substance whose main component is PZT with the perovskite type structure will be shown below. As to peaks resulting from a piezoelectric substance measured by $2\theta/\theta$ measurement of X-ray diffraction, only peaks belonging to an {L00} plane (L=1, 2, 3 . . . , n: n is an integer), such as {100} and {200} are detected. In addition, {100} in the present invention is an expression of generically naming a total of six planes generally expressed in (100), (010), (001), and the like. Similarly, <100> in the present invention is an expression of generically naming a total of six orientations generally expressed in [100], [010], [001], and the like.

Generally, for example, [100] and [001] are the same when a crystal system is a cubic, but they should be distinguished in the case of a monoclinic, a tetragonal, or a rhombohedral. However, even if being monoclinic, tetragonal, or rhombohedral, a crystal with the perovskite type structure which is represented by PZT has lattice constants near those of a cubic. Hence, in the present invention, [100] and [001] of a tetragonal, and [111] and [-1-1-1] of a rhombohedral are named generically <100> and <111>. In addition, although <100> orientation in the present invention means that the piezoelectric substance has <100> single crystal orientation in a thickness direction, it is called the <100> orientation even if a crystal axis has a tilt of several degrees, for example, a <100> crystal axis leans by about 5° from the thickness direction.

It is possible to confirm an orientation rate of the piezoelectric substance of this embodiment using X-ray diffraction. For example, when a piezoelectric substance is <100> orientation, the piezoelectric substance is arranged so that diffraction of {100} of the piezoelectric substance may be most strongly detected by $2\theta/\theta$ measurement of X-ray diffraction. At this time, the <100> orientation rate is defined as a rate of the sum of all the reflection peak strengths resulting from an {L00} plane (L=1, 2, 3 . . . , n: n is an integer) to the sum of all the reflection peak strengths resulting from piezoelectric substance.

In addition, although a uniaxial crystal in the present invention means a crystal having single crystal orientation in a thickness direction of a piezoelectric substance, intra-film orientation of a crystal is no object especially. For example, a<100> uniaxial crystal is a film that a crystal with only <100> orientation is formed in its thickness direction. It is possible to confirm using X-ray diffraction whether the piezoelectric substance of this embodiment is the uniaxial crystal. For example, in the case of a piezoelectric substance which is constructed of <100> uniaxial crystals of PZT with the perovskite type structure, as to peaks resulting from the piezoelectric substance in the $2\theta/\theta$ measurement of X-ray diffraction, only peaks of an {L00} plane (L=1, 2, 3 . . . , n: n is an integer), such as {100} and {200} are detected. In addition, when pole measurement of a {110} asymmetric plane is performed, poles of the {110} asymmetric planes of respective crystals are measured as a ring-like pattern in positions where an inclination of the piezoelectric substance from the thickness direction (normal line direction of {L00} planes of crystals of the piezoelectric substance) shown by an arrow in FIG. 3 corresponds to about 45°.

In addition, the single crystal in the present invention means a crystal having single crystal orientation in a film thickness direction and an intra-film direction. For example, a piezoelectric substance which is constructed of a <100> single crystal is a piezoelectric substance constructed of a single crystal or a plurality of crystals whose thickness direction is only <100> orientation, and in which a certain direction in an intra-film direction is only <110> orientation. It is possible to confirm using X-ray diffraction whether the piezoelectric substance of this embodiment is the uniaxial crystal. For example, in the case of a piezoelectric substance which is constructed of a <100> single crystal of PZT with the perovskite type structure, as to peaks resulting from the piezoelectric substance in the $2\theta/\theta$ measurement of X-ray diffraction, only peaks of an {L00} plane (L=1, 2, 3 . . . , n: n is an integer), such as {100} and {200} are detected. In addition, when pole measurement of a {110} asymmetric plane is performed, a pattern shown in FIG. 4 is measured. That is, poles of the {110} asymmetric planes of respective crystals are measured as a fourfold-symmetric spot-like pattern in positions every 90° on a circumference where an inclination of the piezoelectric substance from the thickness direction (normal line direction of (L00) planes of crystals of the piezoelectric substance) shown by an arrow corresponds to about 45°.

In addition, as for the single crystal or uniaxial crystal in this embodiment, the following is mentioned. For example, the pole measurement of {110} asymmetric planes is performed using the PZT perovskite type structure with <100> orientation. At this time, a crystal poles of the {110} asymmetric planes of respective crystals are measured as an eightfold- or twelvefold-symmetric pattern in positions every 45° or 30° on a circumference where an inclination of the piezoelectric substance from the thickness direction (normal line direction of {L00} planes of crystals of the piezoelectric substance) corresponds to about 45° is mentioned. In addition, since a crystal a pattern of which is not a spot but an elliptic is also a crystal which has intermediate symmetry between the single crystal and uniaxial crystal in this embodiment, this is regarded as a single crystal or a uniaxial crystal in a wide sense. Similarly, in the present embodiment, for example, also when a plurality of crystal phases such as a monoclinic and a tetragonal, a monoclinic and a rhombohedral, a monoclinic, a tetragonal, and a rhombohedral, a monoclinic and another crystal phase are intermingled (mixed phase), each of these is regarded as a single crystal or a uniaxial crystal in a wide sense. Furthermore, also when a crystal resulting from a twin crystal or the like is intermingled, or there is a dislocation, a defect, or the like, it is regarded as a single crystal or a uniaxial crystal in a wide sense.

Although crystal orientation of the piezoelectric substance of this embodiment can be easily confirmed by the X-ray diffraction as mentioned above, besides the above-described X-ray diffraction, for example, it is possible to confirm it by sectional observation by a transmission electron microscope (TEM) or the like. In this case, also in the case where crystal dislocation exists columnarly in a thickness direction or a twin crystal can be confirmed, it is regarded as a single crystal in a wide sense.

It is possible to specify a crystal phase of a piezoelectric substance by reciprocal space mapping of the X-ray diffraction. For example, when a piezoelectric substance with <100> orientation of PZT is a cubic, reciprocal lattice points of (004) and (204) are measured by the reciprocal space mapping. Consequently, relation between magnitude $Q_y(004)$ in the y-axis direction of a (004) reciprocal lattice point and magnitude $Q_y(204)$ in the y-axis direction of a (204) reciprocal lattice point becomes $Q_y(004)=Q_y(204)$. Hence, it is possible to obtain such reciprocal lattice points that the relation between the magnitude $Q_y(004)$ in the y-axis direction of a (004) reciprocal lattice point and the magnitude $Q_x(204)$ in the x-axis direction of a (204) reciprocal lattice point may become $Q_y(004)=2Q_x(204)$.

In addition, when a piezoelectric substance with <100> orientation of PZT is a tetragonal, reciprocal lattice points of (004) and (204) are measured by the reciprocal space mapping. Consequently, relation between magnitude $Q_y(004)$ in the y-axis direction of a (004) reciprocal lattice point and magnitude $Q_y(204)$ in the y-axis direction of a (204) reciprocal lattice point becomes $Q_y(004)=Q_y(204)$. Hence, it is possible to obtain such reciprocal lattice points that the relation between the magnitude $Q_y(004)$ in the y-axis direction of a (004) reciprocal lattice point and the magnitude $Q_x(204)$ in the x-axis direction of a (204) reciprocal lattice point may become $Q_y(004)<2Q_x(204)$.

In addition, when a piezoelectric substance with <100> orientation of PZT is a monoclinic, (004) and (204) are measured by the reciprocal space mapping. Consequently, relation between magnitude $Q_y(004)$ in the y-axis direction of a (004) reciprocal lattice point and magnitude $Q_y(204)$ in the y-axis direction of a (204) reciprocal lattice point becomes $Q_y(004)>Q_y(204)$ or $Q_y(004)<Q_y(204)$. Hence, it is possible to obtain such reciprocal lattice points that the relation between the magnitude $Q_y(004)$ in the y-axis direction of the (004) reciprocal lattice point and the magnitude $Q_x(204)$ in the x-axis direction of the (204) reciprocal lattice point may become $Q_y(004)<2Q_x(204)$. At this time, it is no matter even if two (204) reciprocal lattice points which become $Q_y(004)>Q_y(204)$ and $Q_y(004)<Q_y(204)$ appear. It seems that these two reciprocal lattices have relation of a twin crystal.

In addition, when a piezoelectric substance with <100> orientation of PZT is a rhombohedral, (004) and (204) are measured by the reciprocal space mapping. Consequently, relation between magnitude $Q_y(004)$ in the y-axis direction of a (004) reciprocal lattice point and magnitude $Q_y(204)$ in the y-axis direction of a (204) reciprocal lattice point becomes $Q_y(004)>Q_y(204)$ or $Q_y(004)<Q_y(204)$. Hence, it is possible to obtain such reciprocal lattice points that the relation between the magnitude $Q_y(004)$ in the y-axis direction of the (004) reciprocal lattice point and the magnitude $Q_x(204)$ in the x-axis direction of (204) may become $Q_y(004) \approx 2Q_x(204)$. At this time, it is no matter even if two (204) reciprocal lattice points which become $Q_y(004)>Q_y(204)$ and $Q_y(004)<Q_y(204)$ appear. It seems that these two reciprocal lattices have relation of a twin crystal.

Similarly, also in another orientation or another crystal phase, it is possible to specify simply a crystal phase of a piezoelectric substance by the reciprocal space mapping of the X-ray diffraction. Besides the above-described method, it is possible to perform confirmation also by, for example, sectional observation by a TEM or the like. Here, the y-axis of a reciprocal space is a thickness direction of a piezoelectric substance, and the x-axis is a certain direction in the intra-film direction of the piezoelectric substance.

Although a forming method of the piezoelectric substance of this embodiment is not limited particularly, in regard to a thin film of 10 µm or less, usually, it is possible to use thin film forming methods such as the sol gel method, a hydrothermal crystallization method, the gas deposition method, and an electrophoresis. Furthermore, it is possible to use thin film forming methods such as the sputtering method, chemical vapor phase deposition method (CVD method), a metal-organic chemical vapor deposition (MOCVD method), an ion beam deposition method, a molecular beam epitaxy method, and a laser ablation method. Since these thin film forming methods make it possible to make a piezoelectric substance uniaxialized or single-crystallized by using epitaxial growth from a substrate or a lower electrode, it becomes easy to form the piezoelectric element which has further higher piezoelectricity.

It is preferable to form the piezoelectric substance 7 of this embodiment by the sputtering method. A target whose main component is lead zirconate titanate is used as a target. It is preferable to make the element ratio {Pb/(Zr+Ti)}Target of Pb, Zr and Ti of a target Pb/(Zr+Ti)>{Pb(Zr+Ti)} Target to the element ratio Pb/(Zr+Ti) of the piezoelectric substance.

When the piezoelectric substance 7 is formed by the sputtering method so that the above-mentioned relation may be satisfied, it is possible to suppress an increase of a leakage current in spite of an excessive addition of Pb. In addition, it is preferable to use a target, whose main component is lead zirconate titanate whose target density is 90% or less, as a target. Thereby, it is possible to easily form a piezoelectric substance that the element ratio Pb/(Zr+Ti) of Pb, Zr and Ti of the piezoelectric material satisfies relation of Pb/(Zr+Ti)>{Pb/(Zr+Ti)}Target to the element ratio {Pb/(Zr+Ti)}Target of Pb, Zr and Ti of a target. In addition, the above-mentioned target density (%) is a density (%) of a target to a theoretical density of lead zirconate titanate.

When a piezoelectric substance is formed in this manner, even if a film thickness of the piezoelectric substance is 1 µm or more, it becomes easy to obtain the piezoelectric substance with a monoclinic. The monoclinic piezoelectric substance of this embodiment is a crystal phase which is particularly easy to obtain the element ratio Zr/(Zr+Ti) of Zr and Ti which is 0.5 to 0.6 inclusive. This composition is called a crystal phase boundary (Morphotropic Phase Boundary: MPB) composition of bulk PZT, and it is especially possible to expect large piezoelectricity.

As a forming method of a piezoelectric substance by the sputtering method, it is possible to mention a heat sputtering method of forming a substrate at about 600° C. with heating it so as to obtain a piezoelectric substance a main component which is PZT which has the perovskite type structure. In addition, it is possible to mention a low-temperature sputtering method of making a piezoelectric substance a perovskite type crystal by post-sintering after forming the piezoelectric substance, whose main component is amorphous PZT, at a temperature of 300° C. or less. In the forming method of the piezoelectric substance in this embodiment, either method may be used. In addition, it is also sufficient to perform post-sintering after forming a piezoelectric substance by the heat sputtering method. Nevertheless, since the heat sputtering method is easier for uniaxialization and single crystallization of a piezoelectric substance, it is preferable to form the piezoelectric substance using the heat sputtering method.

The piezoelectric element of this embodiment has the piezoelectric substance of this embodiment, and a pair of electrodes which contacts the piezoelectric substance. It is preferable that a first electrode (electrode film) or a second electrode (electrode film) of the piezoelectric element of this embodiment has satisfactory adhesion with the above-mentioned piezoelectric substance, and is constructed of a highly conductive material, that is, a material having a specific resistance of an upper electrode film or a lower electrode film of $10^{-7}$ to $10^{-2}$ ohm·cm. Although such a material is generally a metal in many cases, it is preferable to use a metal of a Pt group, such as Au, Ag, Cu, Ru, Rh, Pd, Os, Ir, or Pt, as an electrode material. In addition, since an alloy material which includes the above-mentioned material, such as silver paste or solder also has high electroconductivity, it is possible to preferably use it. In addition, conductive oxide materials, such as IrO (oxidation iridium), SRO (ruthenium acid strontium), ITO (conductive tin oxide), and BPO (barium metaplumbate), are also preferable as electrode materials. In addition, either one-layer structure or multilayer structure may be sufficient as the electrode film. For example, in order to increase adhesion with a substrate, structure such as Pt/Ti may be also sufficient. As to a film thickness of the electrode film, it is preferable to be about 100 to 1000 nm, and it is further preferable to be 500 nm or less. When the film thickness of the electrode film is made 100 nm or more, resistance of the electrode film becomes small enough, and when 1000 nm or less, there is no possibility of obstructing the piezoelectricity of the piezoelectric element, and hence, it is preferable.

In addition, when the first electrode film contains an oxide electrode film with the perovskite type structure which is given at least <100> orientation, it is possible to produce easily a uniaxial film or a single crystal film which is given <100> orientation. In particular, since SRO has a lattice constant of about 4 Å close to a lattice constant of PZT, it is possible to easily produce a uniaxial film or a single crystal film.

Although a forming method of the electrode film in this embodiment is not limited particularly, in regard to a thin film of 1000 nm or less, usually, it is possible to form it using thin film forming methods such as the sol gel method, hydrothermal crystallization method, gas deposition method, and electrophoresis. Furthermore, it is possible to form it using thin film forming methods such as the sputtering method, CVD method, MOCVD method, ion beam deposition method, molecular beam epitaxy method, and laser ablation method. Since these thin film forming methods make it possible to make the electrode film uniaxialized or single-crystallized by using epitaxial growth from a substrate or a buffer layer, it becomes easy to make the piezoelectric substance uniaxialized or single-crystallized.

Next, a liquid discharge head of this embodiment will be explained.

The liquid discharge head of this embodiment has a discharge port, an individual liquid chamber communicating with the discharge port, a piezoelectric element provided in correspondence with the individual liquid chamber, and a vibrating plate provided between the above-mentioned individual liquid chamber and the above-mentioned piezoelectric element. Furthermore, the liquid discharge head is characterized in that liquid in the above-mentioned individual liquid chamber is discharged from the above-mentioned discharge port by a volume change in the above-mentioned individual liquid chamber occurring by the above-mentioned vibrating plate, and that the above-mentioned piezoelectric element is the piezoelectric element of this embodiment.

Using the piezoelectric element of this embodiment as a piezoelectric element makes it possible to easily obtain a liquid discharge head, which exerts uniform and high discharging performance and can perform fine patterning. The liquid discharge head of this embodiment may be used for image forming apparatuses, such as a liquid discharge apparatus, a fax, a compound machine, and a copier, or industrial discharge apparatus of discharging liquid other than ink.

Figure 6:
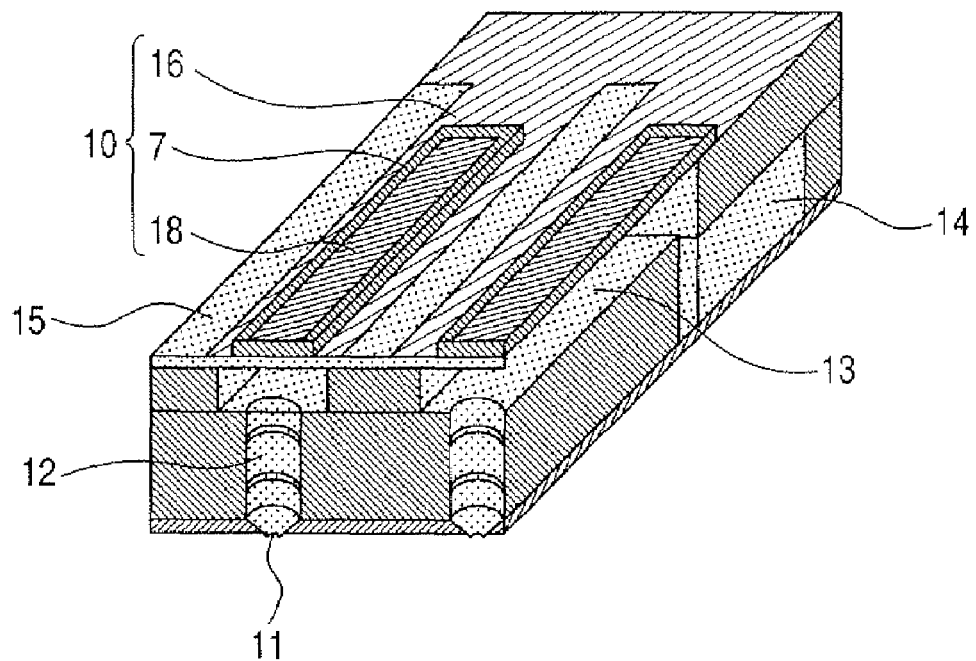
FIG. 6 is a schematic diagram showing an example of an embodiment of a liquid discharge head of this embodiment.

The liquid discharge head of this embodiment will be explained with reference to FIG. 6. FIG. 6 is a schematic diagram showing an example of the embodiment of the liquid discharge head of this embodiment. The liquid discharge head of this embodiment shown in FIG. 6 is equipped with a discharge port 11, a communication hole 12 which makes the discharge port 11 and an individual liquid chamber 13 communicate with each other, and a common liquid chamber 14 which supplies liquid to the individual liquid chamber 13. And, the liquid is supplied to the discharge port 11 along with this communication route. A part of the individual liquid chamber 13 is constructed of a vibrating plate 15. The piezoelectric element 10 for giving vibration to the vibrating plate 15 is provided in the exterior of the individual liquid chamber 13. When the piezoelectric element 10 is driven, the vibrating plate 15 is given vibration by the piezoelectric element 10, and causes a volume change in the individual liquid chamber 13. Thereby, the liquid in the individual liquid chamber 13 is discharged from the discharge port. Although the piezoelectric element 10 is rectangular in the embodiment shown in FIG. 6, this shape may be also elliptical, circular, and parallelogramic.

Figure 7:
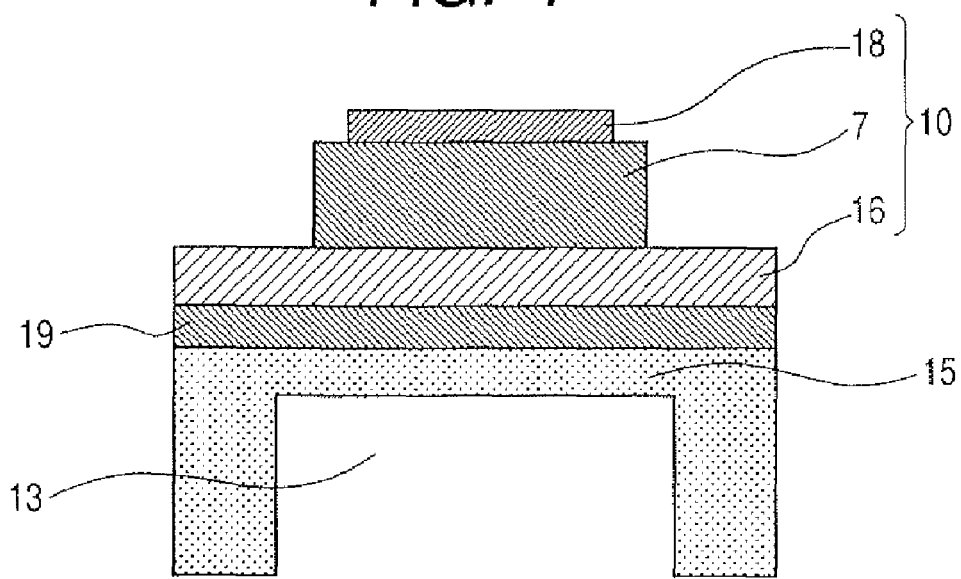
FIG. 7 is a sectional schematic diagram in a width direction of the liquid discharge head of FIG. 6.

FIG. 7 shows a sectional schematic diagram in a width direction of the liquid discharge head shown in FIG. 6. The piezoelectric element 10 which constructs the liquid discharge head of this embodiment will be explained further in detail with reference to FIG. 7. Although a sectional shape of the piezoelectric element 10 is shown by as a rectangle, a trapezoid or an inverted trapezoid may be also sufficient. In addition, although the first electrode film 6 is equivalent to the lower electrode film 16 and the second electrode film 8 is equivalent to the upper electrode film 18 in FIG. 7, the first electrode film 6 and second electrode film 8 which construct the piezoelectric element 10 of this embodiment may be made the lower electrode film 16 and upper electrode film 18, respectively, and vice versa. This is based on a production method at the time of device production, and either can obtain the effect of the present embodiment. In addition, the vibrating plate 15 may be formed from the substrate 5 which constructs the piezoelectric element 10 of this embodiment. In addition, there may be a buffer layer 19 between the vibrating plate 15 and the lower electrode film 16.

Figure 8:
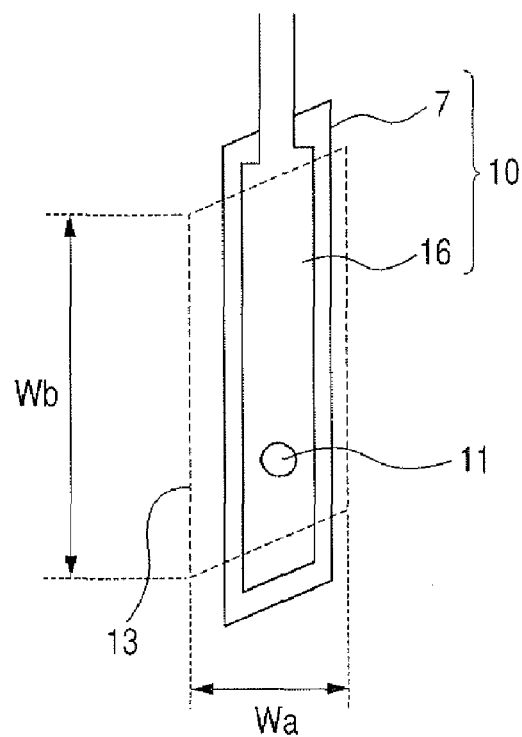
FIG. 8 is a schematic diagram of the liquid discharge head of FIG. 6 in view of a top face side (discharge port side).
Figure 9:
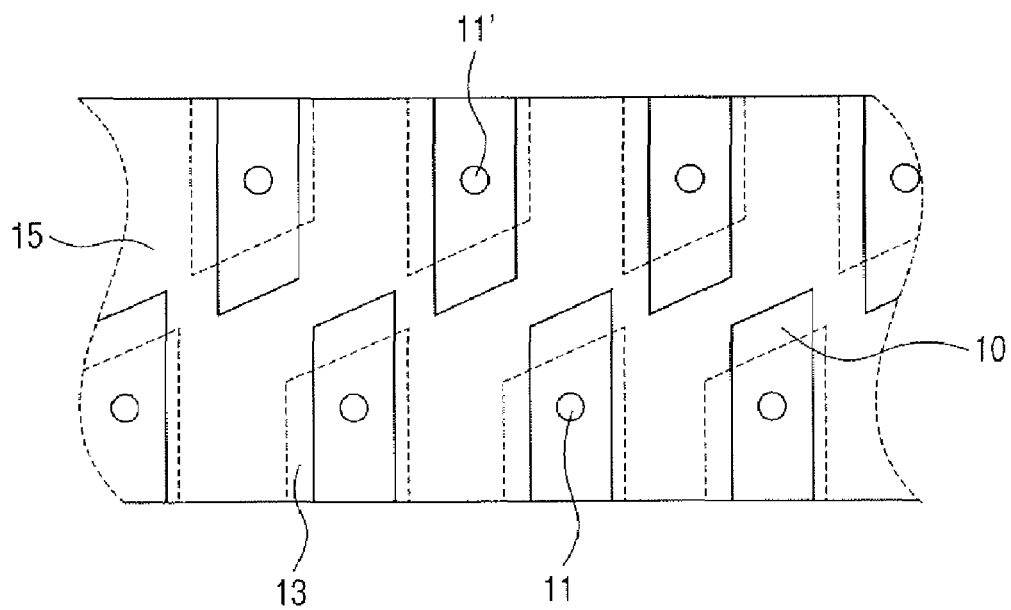
FIG. 9 is a schematic diagram of the liquid discharge head of FIG. 6 in view of a top face side (discharge port side).

FIGS. 8 and 9 are schematic diagrams of the liquid discharge head, shown in FIG. 6, in view of a top face side (discharge port 11 side). A region 13 shown by a dotted line expresses the individual liquid chamber 13 to which pressure is applied. The piezoelectric element 10 is patterned suitably and formed on the individual liquid chamber 13. For example, in FIG. 8, the lower electrode film 16 is drawn out to a portion in which the piezoelectric substance 7 does not exist, and the upper electrode film 18 (not shown) is drawn out to an opposite side of the lower electrode film 16 and is connected to a drive source. Although FIGS. 8 and 9 show a state that the lower electrode film 16 has been patterned, it may exist in a portion where the piezoelectric substance 7 does not exist as shown in FIG. 7. When there is no trouble, such as a short and disconnection, between a drive circuit and the piezoelectric element 10 when driving the piezoelectric element 10, the piezoelectric substance 7, lower electrode film 16, and upper electrode film 18 can be optimally patterned in accordance with an object. In addition, a reason why a shape of the individual liquid chamber 13 is shown in a parallelogram is because it becomes such a shape when an individual liquid chamber is produced by wet etching by alkali using an Si (110) substrate as a substrate. Besides this, the shape of the individual liquid chamber 13 may be either a rectangle or a square. Generally, although two or more individual liquid chambers 13 are produced in fixed intervals on the vibrating plate 15, as shown in FIG. 9, the individual liquid chambers 13 may be disposed in staggered arrangement, or the number of them may be one depending on an object.

A thickness of the vibrating plate 15 is usually 0.5 to 10 μm, and is 1.0 to 6.0 μm preferably. When there is the above-mentioned buffer layer 19, the thickness of the buffer layer is also included in this thickness. In addition, a plurality of layers besides the buffer layer may be formed. For example, when forming a vibrating plate and an individual liquid chamber from the same substrate, a required etch stop layer and the like may be included. A width Wa (refer to FIG. 8) of the individual liquid chamber 13 is usually 30 to 180 μm. Although a length Wb (refer to FIG. 8) is based also on an amount of discharge liquid droplets, it is usually 0.3 to 6.0 mm. A form of the discharge port 11 is usually a circular or a star, and a diameter is preferably 7 to 30 μm usually. It is preferable that a sectional shape of the discharge port 11 is a tapered shape expanded in a direction of the communication hole 12. A length of the communication hole 12 is usually 0.05 to 0.5 mm preferably. When the length of the communication hole 12 is made 0.5 mm or less, discharging speed of a liquid droplet becomes fast enough. In addition, when being 0.05 mm or more, dispersion in the discharging speed of a liquid droplet which is discharged from each discharge port becomes small preferably. In addition, members which form the vibrating plate, individual liquid chamber, common liquid chamber, communication hole, and the like which construct the liquid discharge head of this embodiment may be the same material, or may be different materials, respectively. For example, when it is Si and the like, it is processible with sufficient accuracy by using a lithography method and an etching method. In addition, as members selected when different ones, materials, difference among coefficients of thermal expansion each of which is $1\times10^{-8}/°$ C. to $1\times10^{-6}/°$ C., are preferable. For example, it is preferable to select a SUS substrate, Ni substrate, and the like to a Si substrate.

Next, a production method of a liquid discharge head of this embodiment will be explained. The production method of a liquid discharge head of this embodiment has at least the following steps.

(1) Step of forming discharge port (2) Step of forming communication hole making discharge port and individual liquid chamber communicate (3) Step of forming individual liquid chamber (4) Step of forming common liquid chamber communicating with individual liquid chamber (5) Step of forming vibrating plate giving vibration to individual liquid chamber (6) Step of producing piezoelectric element of this embodiment for giving vibration to vibrating plate provided in exterior of individual liquid chamber Specifically, for example, as a first method of producing the liquid discharge head of this embodiment, a method to be described next can be mentioned. First, a part of an individual liquid chamber and a vibrating plate are formed with applying step (3) on a substrate on which the piezoelectric element 10 is formed with applying the above-mentioned step (6). A substrate on which the communication hole and the common liquid chamber are formed with applying steps (2) and (4) separately, and a substrate having the discharge port is produced with applying step (1). Next, the above-mentioned substrates and these substrates are stacked and unified, and the liquid discharge head is produced.

In addition, as a second method of producing the liquid discharge head of this embodiment, a method to be described next can be mentioned. First, separately, a substrate on which an individual liquid chamber is formed with applying at least step (3), or a substrate on which an individual liquid chamber is formed is produced. Next, the piezoelectric element, or the vibrating plate and piezoelectric element are transferred on this from the substrate on which the piezoelectric element is formed with applying step (6) or the substrate on which the vibrating plate and piezoelectric element are formed at steps (5) and (6). Next, the individual liquid chamber is formed by processing a substrate portion in a side, which faces at least the piezoelectric element and the like, of the substrate, on which the piezoelectric element, or the vibrating plate and piezoelectric element are transferred, with applying step (2). Further, similarly to the above-described first method, the substrate on which the communication hole and common liquid chamber are formed, and the substrate on which the discharge port is formed are produced, and these substrates are stacked and unified for the liquid discharge head to be produced.

Figure 10:
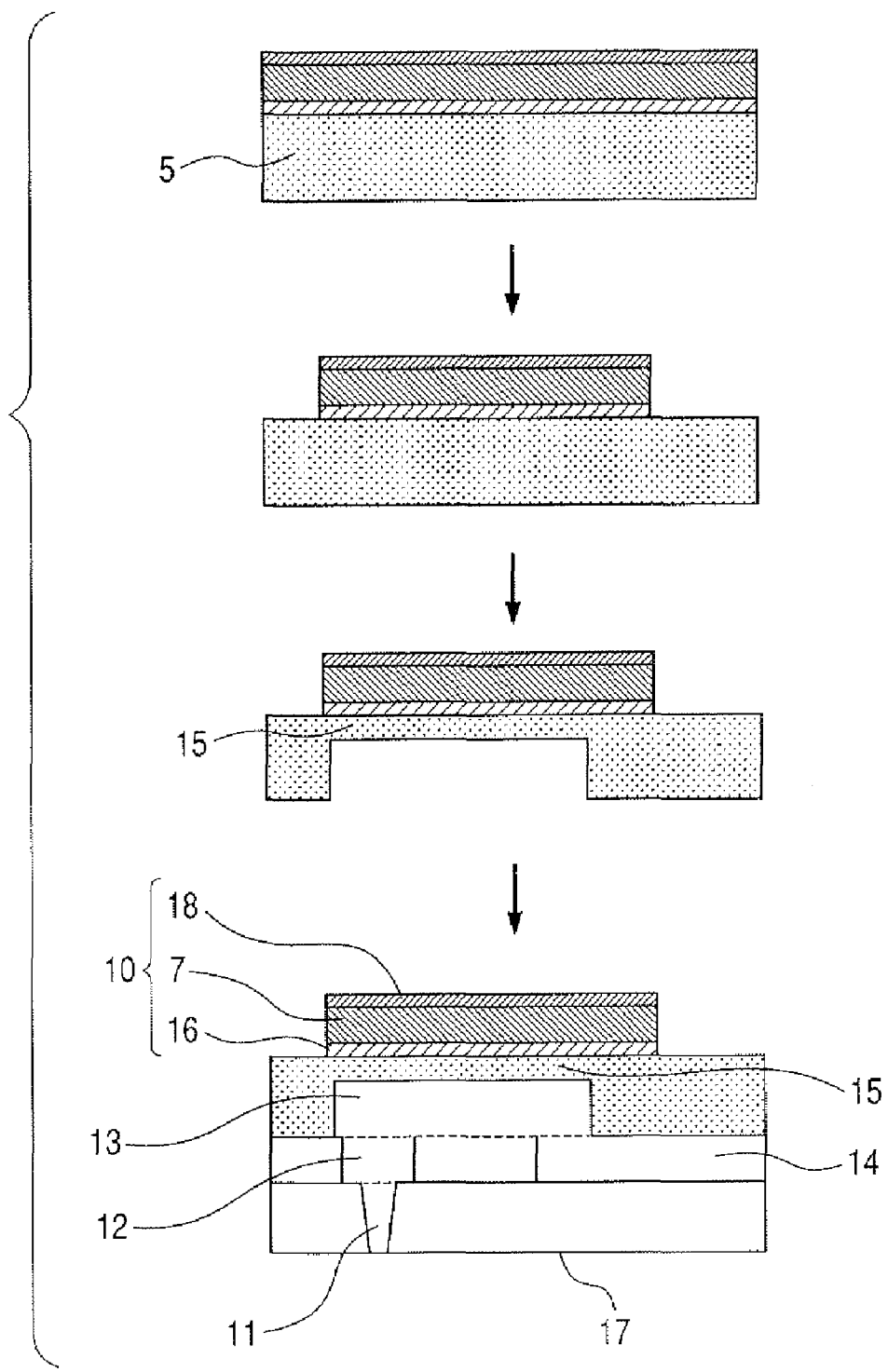
FIG. 10 is a schematic diagram showing an example of a production process of a liquid discharge head of this embodiment.

As the first method, as shown in FIG. 10, first, similarly to the production method of a piezoelectric element, the piezoelectric element 10 is provided on the substrate 5. Next, the vibrating plate 15 is formed while removing a part of the substrate 5 at least in a state of patterning the piezoelectric element 10 to form a part of the individual liquid chamber 13. Separately, a substrate which has the common liquid chamber 14 and communication hole 12 is produced, and further, a substrate on which the discharge port 11 is formed is produced. It is possible to mention a production method of further stacking and unifying these to form the liquid discharge head. As a method of removing a part of the substrate 5, it is possible to mention a method, such as a wet etching method, a dry etching method, or a sand mill method. It is possible to form at least parts of the vibrating plate 15 and individual liquid chamber 13 by removing a part of the substrate 5 by such a method.

Figure 11:
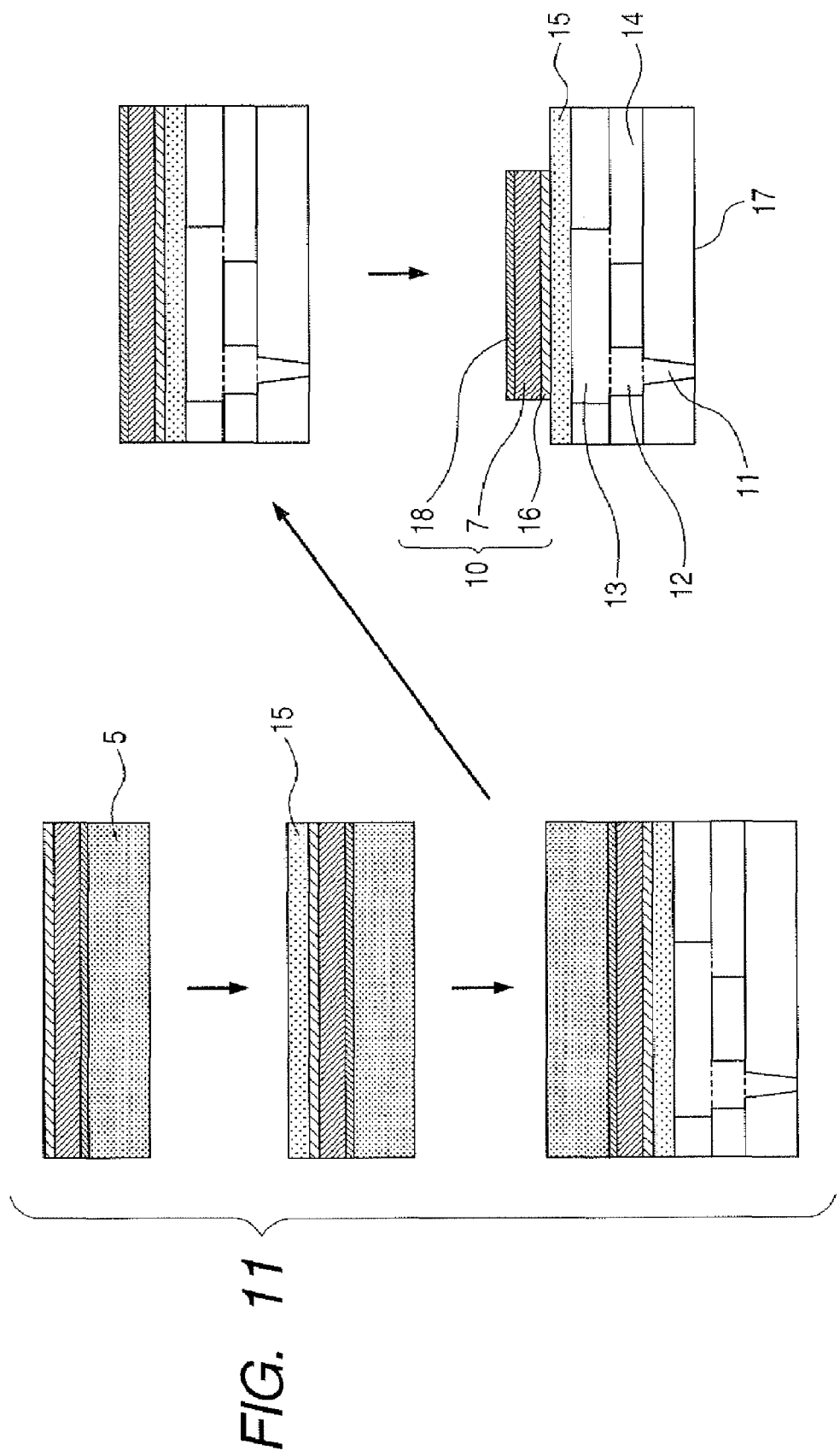
FIG. 11 is a schematic diagram showing another example of a production process of a liquid discharge head of this embodiment.

As the second method, for example, as shown in FIG. 11, first, similarly to the production method of a piezoelectric element, the piezoelectric element 10 is provided on the substrate 5. Next, a substrate on which the vibrating plate 15 is formed as a film on the piezoelectric element in a state that the piezoelectric element 10 is not patterned is produced. It is possible to mention a production method of further producing a substrate of providing the individual liquid chamber 13, a substrate of providing the communication hole 12 and common liquid chamber 14, a substrate of providing the discharge port 11, and the like, stacking these thereafter, and transferring the vibrating plate, piezoelectric element, and the like from the above-mentioned substrates.

Figure 12:
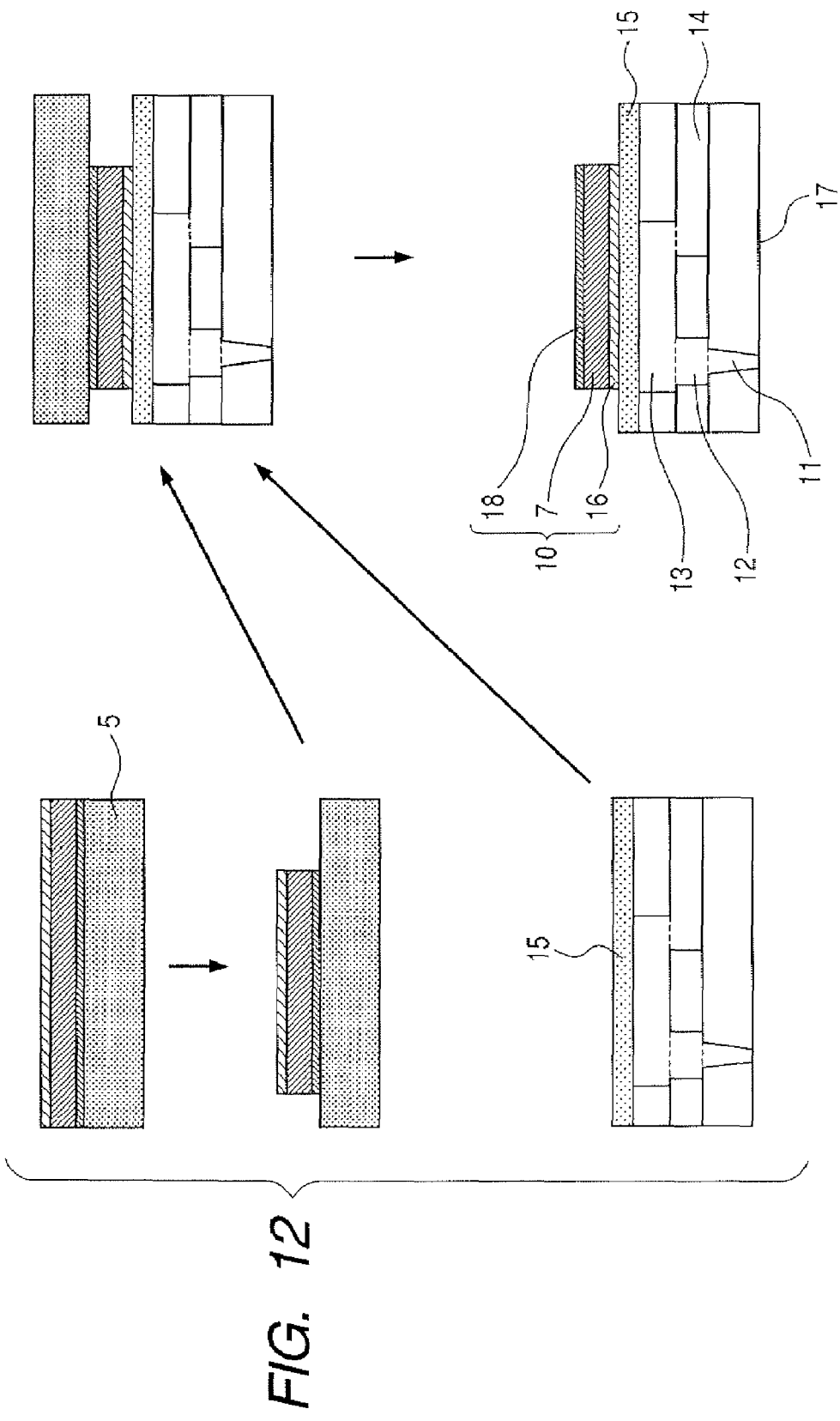
FIG. 12 is a schematic diagram showing a further example of a production process of a liquid discharge head of this embodiment.

Moreover, as shown in FIG. 12, first, the piezoelectric element 10 is formed on the substrate 5, and this is patterned for the piezoelectric element to be formed. Separately, a substrate of providing the vibrating plate 15 on the substrate and further providing a part of the individual liquid chamber 13, a substrate of providing the common liquid chamber 14 and communication hole 12, and a substrate of forming the discharge port 11 are produced. It is possible to mention a production method of further stacking these, and transferring the piezoelectric element 10 on this from the above-mentioned substrate to form the liquid discharge head.

As a bonding method at the time of transfer, although a method of using an inorganic adhesive or an organic adhesive may be used, metal bonding by an inorganic material is more preferable. As a material used for the metal bonding, it is possible to mention In, Au, Cu, Ni, Pb, Ti, Cr, Pd, and the like. Since it is possible to perform bonding at a low temperature of 300° C. or less and difference of a coefficient of thermal expansion therebetween that of the substrate becomes small when these are used, there is also little damage to the piezoelectric element while it is possible to avoid a problem by warpage of the piezoelectric element and the like when being elongated.

Figure 13A:
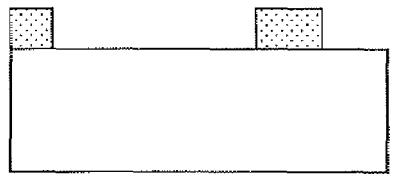
FIGS. 13A, 13B, 13C, 13D, 13E and 13F are schematic diagrams showing an example of a production process of a liquid discharge head of this embodiment.
Figure 13B:
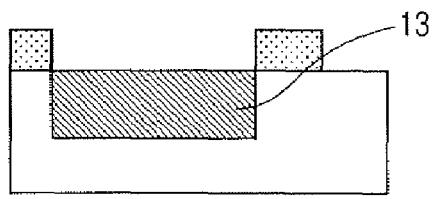
Figure 13C:
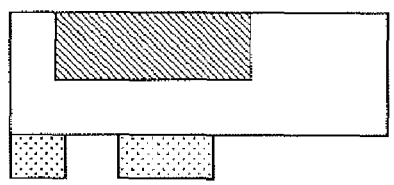
Figure 13D:
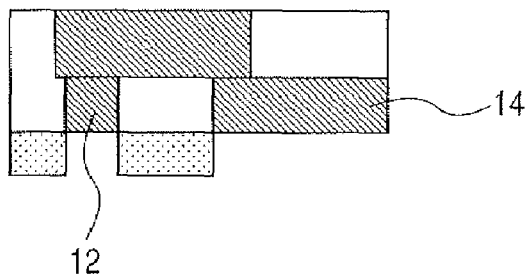
Figure 13E:
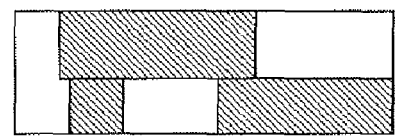
Figure 13F:
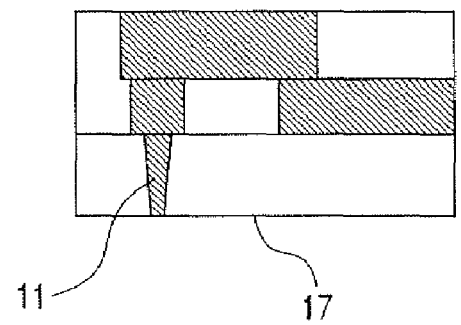

It is possible to form the communication hole 12 and common liquid chamber 14 in the first method, and the individual liquid chamber 13, communication hole 12, and common liquid chamber 14 in the second method by performing, for example, a step of patterning a forming member (substrate) by lithography, and a step of removing a part of the member by etching. For example, in the case of the second method, the individual liquid chamber 13, communication hole 12, and common liquid chamber 14 are formed by steps a) to e) shown in FIGS. 13A, 13B, 13C, 13D, 13E and 13F. FIG. 13A shows a forming step of a mask for the individual liquid chamber 13, and FIG. 13B shows a step of processing the individual liquid chamber 13 (a hatched portion means a processed portion) by etching and the like from an upper portion. In addition, FIG. 13C shows a step of removing the mask used for the formation of the individual liquid chamber 13, and forming a mask for the communication hole 12 and common liquid chamber 14, and FIG. 13D shows a step of processing the communication hole 12 and common liquid chamber 14 by etching and the like from a lower portion. Moreover, FIG. 13E schematically shows a state of removing the mask used for the formation of the communication hole 12 and common liquid chamber 14 to form the individual liquid chamber 13, communication hole 12, and common liquid chamber 14. The discharge port 11 is formed by giving etching processing, machining, laser processing, or the like to the substrate 17. FIG. 13F shows a state that the substrate 17 in which the discharge port 11 is formed is bonded to the substrate, in which the individual liquid chamber 13, communication hole 12, and common liquid chamber 14 are formed, after step 13E. It is preferable that a surface of the substrate 17 in which the discharge port is provided is water-repellent. Although a bonding method of respective substrates is the same as the bonding method at the time of transfer, anodic oxidation bonding may be also used.

In the second method, it is preferable to use another substrate, to which the piezoelectric element 10 on the substrate 5 is transferred, in a state as shown in FIG. 13E or 13F. Here, when the vibrating plate is formed on the piezoelectric thin-film element on the substrate 5, it is directly transferred on the individual liquid chamber 13 in the state shown in FIGS. 13E or 13F. In addition, when the vibrating plate is not formed on the piezoelectric element on the substrate 5, a hole of the individual liquid chamber 13 in the state shown in FIGS. 13E or 13F is filled up with a resin for the vibrating plate to be formed as a film, and it is transferred after this resin being removed by etching and the vibrating plate is formed. At this time, it is preferable to form the vibrating plate using a thin film forming method such as the sputtering method or CVD method. In addition, the pattern forming step of the piezoelectric element 10 may be either before or after the transfer.

Next, a liquid discharge apparatus of this embodiment will be explained. The liquid discharge apparatus of this embodiment has the above-mentioned liquid discharge head of this embodiment.

Figure 14:
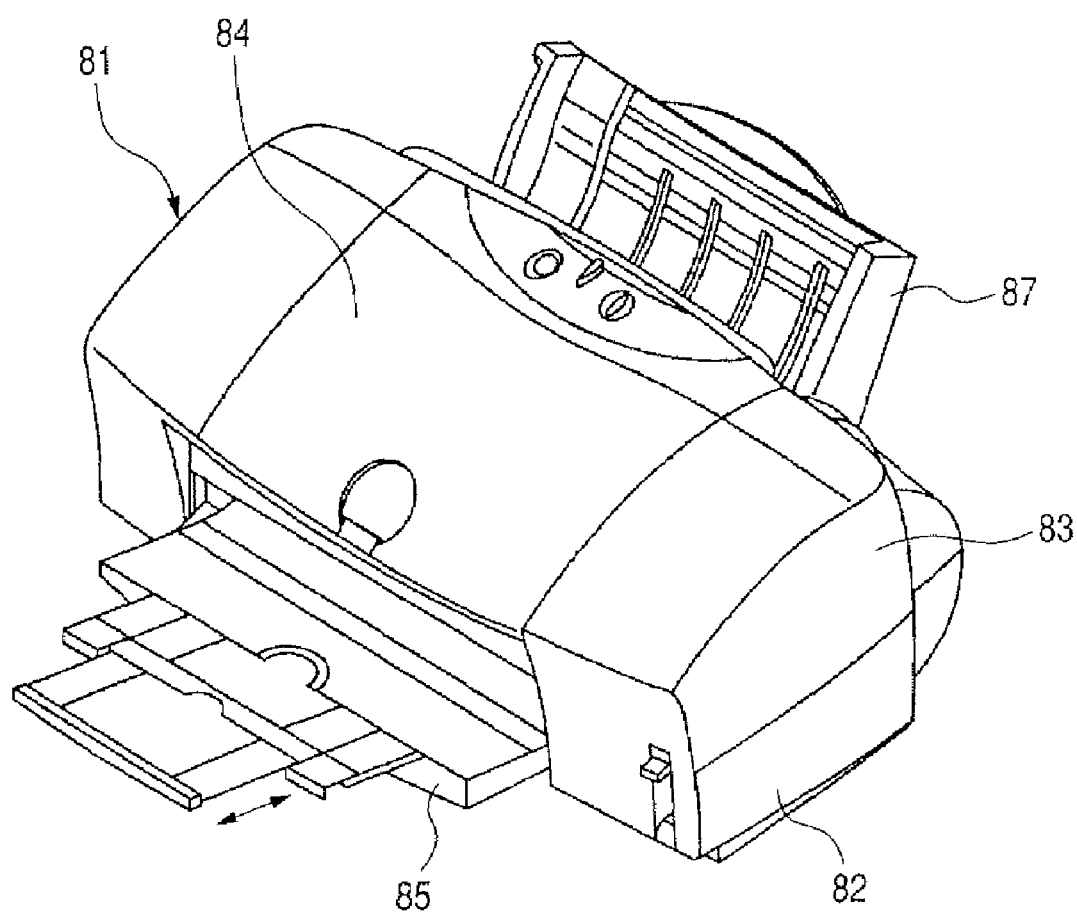
FIG. 14 is a perspective view showing an embodiment of a liquid discharge apparatus of this embodiment.
Figure 15:
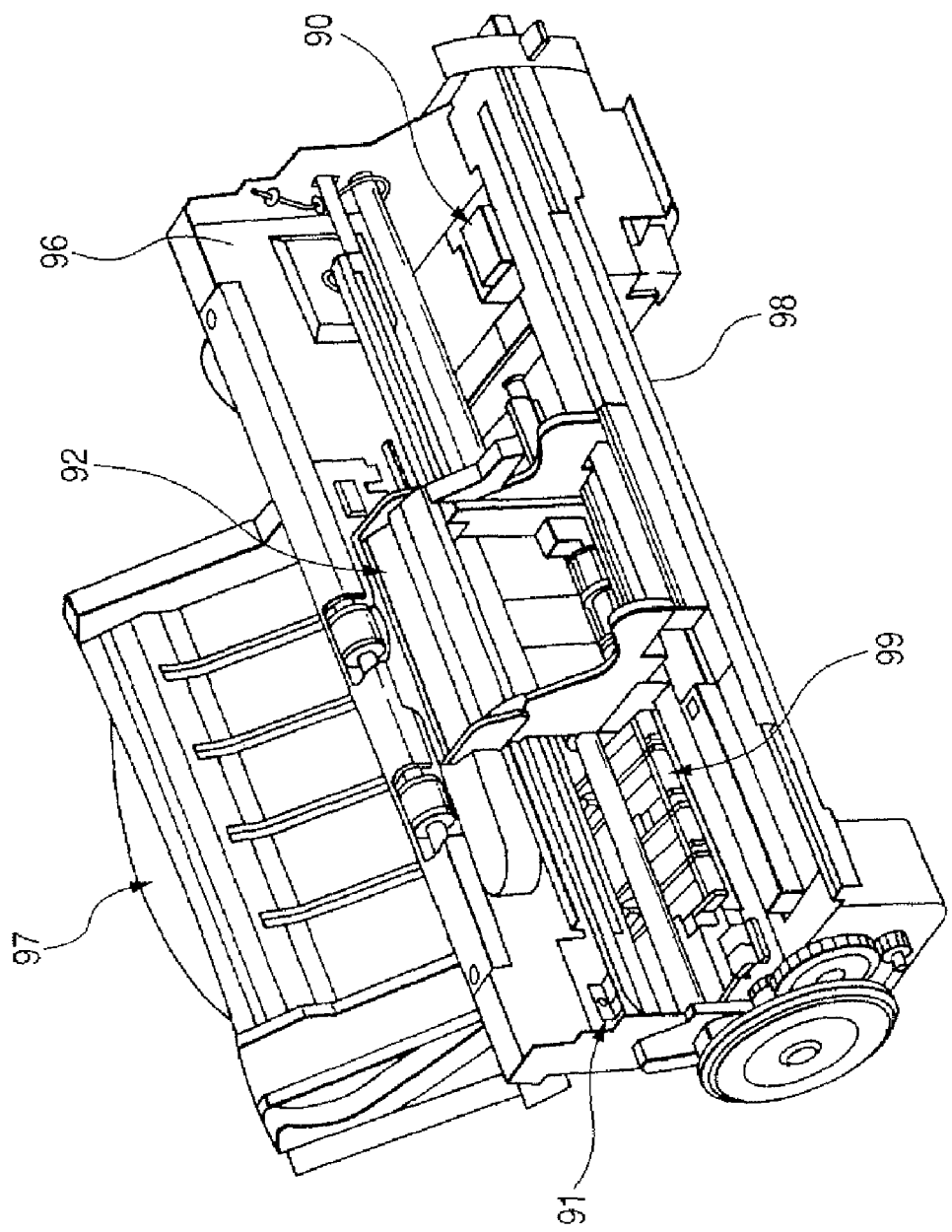
FIG. 15 is a perspective view showing an embodiment of a liquid discharge apparatus of this embodiment.

As an example of the liquid discharge apparatus of this embodiment, it is possible to mention an ink jet recording apparatus shown in FIGS. 14 and 15. FIG. 15 shows a state that the exterior components 82 to 85, and 87 of the liquid discharge apparatus (ink jet recording apparatus) 81 shown in FIG. 14 are removed. The ink jet recording apparatus 81 has an automatic feeding portion 97 which performs automatic feeding of recording paper as a recording medium into an apparatus main body 96. Further, it has a transport portion 99 which introduces the recording paper sent from the automatic feeding portion 97 to a predetermined recording position, and introduces the recording paper from the recording position to a sheet discharging port 98, a recording portion 91 which performs recording on the recording paper transported in the recording position, and a recovery portion 90 which performs recovery processing to the recording portion 91. The recording portion 91 is equipped with a carriage 92 which includes the liquid discharge head of this embodiment, and is reciprocally conveyed on a rail.

In such an ink jet recording apparatus, the carriage 92 is conveyed on the rail by an electric signal sent out from a computer, and when a drive voltage is applied to the electrodes which sandwich the piezoelectric substance, the piezoelectric substance is displaced. Each piezoelectric chamber is pressurized through the vibrating plate 15 by this displacement of the piezoelectric substance, and ink is discharged from the discharge port 11 for printing to be performed.

The liquid discharge apparatus of this embodiment can discharge the liquid at high speed uniformly, and can achieve miniaturization of the apparatus.

Although being exemplified as a printer in the above-mentioned example, the liquid discharge apparatus of this embodiment can be used as an industrial liquid discharge apparatus besides an ink jet recording apparatus for a facsimile, a compound machine, a copier, or the like.

EXAMPLES

Hereafter, the piezoelectric body and the piezoelectric element of this embodiment, the liquid discharge head using this, and its production method will be explained with citing examples.

Example 1

Fabrication sequence of a piezoelectric substance and a piezoelectric element of a first example is as follows.

On a La-doped $SrTiO_3$ {100} substrate which served as a lower electrode, a 3-μm film thickness of piezoelectric substance PZT was formed as a film with holding a substrate temperature of 600° C. by the sputtering method. A material whose main component was PZT and whose target density was 88% was used as a target. The element ratio {Pb/(Zr+Ti)}

Figure 16:
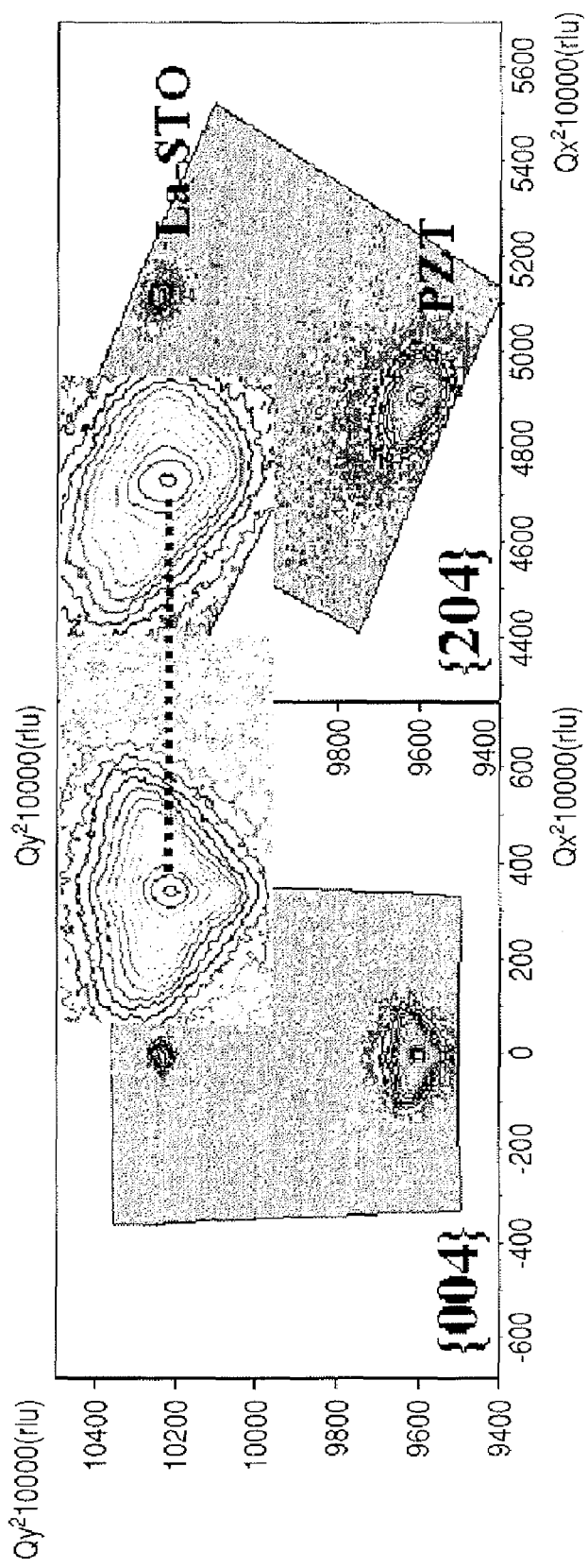
FIG. 16 includes reciprocal lattice mapping charts of {004} and {204} by X-ray diffraction of the piezoelectric substance in a first example.

Target of Pb, Zr, and Ti of a target was made 1.00, and {Zr/(Zr+Ti)} Target was made 0.65. Sputtering was performed on the following conditions. Sputtering gas: Ar/O$_2$=20/1, sputtering power: 1.3 W/cm$^2$, sputtering gas pressure: 0.5 Pa. Film formation was performed so as to obtain 3 μm of film thickness by adjusting sputtering time with holding a substrate temperature at 600° C. According to a composition analysis (ICP composition analysis) by an inductively coupled plasma atomic emission spectrometer, as for element ratios of Pb, Zr, and Ti of the piezoelectric substance, Pb/(Zr+Ti) was 1.40 and Zr/(Zr+Ti) was 0.53. In addition, according to 2θ/θ measurement of X-ray diffraction, only a reflection peak resulting from the {00L} plane (L=1, 2, 3 ..., n: n is an integer) of the perovskite structure of PZT was detected. When positive pole measurement of an asymmetric plane {202} was performed, reflection peaks appeared in fourfold symmetry. Consequently, it was confirmed that the piezoelectric substance was a single crystal PZT film with the perovskite type structure of <100> orientation. Similarly, according to reciprocal lattice mapping (FIG. 16) of {004} and {204} by the X-ray diffraction, it was confirmed that lattice constants of this single crystal film were a=4.08 Å, c=4.16 Å, and β=89.6°, that it was a monoclinic, and that c/a=1.02. In FIG. 16, rlu stands for reciprocal lattice units. In addition, as for reciprocal lattice points resulting from the {204} plane, peaks were divided up and down, and hence, it was confirmed that monoclinics had a relation of a twin crystal. Furthermore, a Curie temperature Tc of the piezoelectric substance was 500° C. Further, by a 4 nm-thick Ti film and a 150 nm-thick Pt film being formed by the sputtering method in this order on the piezoelectric substance as electrode films, a pair of electrodes was formed, and the piezoelectric element of the first example was produced.

Example 2

Fabrication sequence of a piezoelectric substance and a piezoelectric element of a second example is as follows.

Tetrabutoxyzirconium and tetra-i-propoxy titanium were melted in a water mixture of butanol and acetylacetone in conformity to a composition ratio of Zr/Ti which is a target. Liquid of lead raw material liquid being added so as to become excessive lead, after adding 1 mol % of dibenzylmethylamine to a metallic raw material as a base catalyst, and heating and aging it at 50° C. for 12 hours was coated on a La-doped SrTiO$_3$ {100} substrate, which served as a lower electrode, by a spin coating method. As the lead raw material, a solution of a mixture of lead acetate with butanol and i-propanol was used.

Spin coating was repeated after coating, and heating at 600° C. for 30 minutes and at 400° C. for 30 minutes for a film to be formed until a film thickness became 3 μm. Then, heating was performed at 700° C. for 1 hour for the piezoelectric substance to be formed.

According to the ICP composition analysis, as for element ratios of Pb, Zr, and Ti of the piezoelectric substance, Pb/(Zr+Ti) was 1.50 and Zr/(Zr+Ti) was 0.55. In addition, according to 2θ/θ measurement of the X-ray diffraction, only a reflection peak resulting from the {00L} plane (L=1, 2, 3 ..., n: n is an integer) of the perovskite structure of PZT was detected. When the positive pole measurement of an asymmetric plane {202} was performed, reflection peaks appeared in fourfold symmetry. Consequently, it was confirmed that the piezoelectric substance was a single crystal PZT film with the perovskite type structure of <100> orientation. Similarly, according to the reciprocal lattice mapping of {004} and {204} by the X-ray diffraction, it was confirmed that lattice constants of this single crystal film were a=4.08 Å, c=4.11 Å, and β=89.6°, that it was a monoclinic, and that c/a=1.01. In addition, a Curie temperature Tc of the piezoelectric substance was 410° C. Further, by a 4-nm-thick Ti film and a 150-nm-thick Pt film being formed by the sputtering method in this order on the piezoelectric substance as electrode films, a pair of electrode films was formed, and the piezoelectric element of the second example was produced.

Comparative Example 1

A piezoelectric substance and a piezoelectric element of a first comparative example were produced in the following procedure.

As a target, a material whose main component was PZT whose target density was 98%, and in which the element ratio {Pb/(Zr+Ti)} Target of Pb, Zr, and Ti of a target was 1.40 and {Zr/(Zr+Ti)} Target was 0.55 was used. The piezoelectric substance and piezoelectric element of the first comparative example were produced under the same conditions as those in the first example except using the above-mentioned target. According to the ICP composition analysis, as for element ratios of Pb, Zr, and Ti of the piezoelectric substance, Pb/(Zr+Ti) was 1.30 and Zr/(Zr+Ti) was 0.55. In addition, according to the 2θ/θ measurement of the X-ray diffraction, only a reflection peak resulting from the {00L} plane (L=1, 2, 3 ..., n: n is an integer) of the perovskite structure of PZT was detected. When the positive pole measurement of an asymmetric plane {202} was performed, reflection peaks appeared in fourfold symmetry. Consequently, it was confirmed that the piezoelectric substance was a single crystal PZT film with the perovskite type structure of <100> orientation. Similarly, according to the reciprocal lattice mapping of {004} and {204} by the X-ray diffraction, it was confirmed that lattice constants of this single crystal film were a=4.07 Å, c=4.15 Å, and β=90.0°, that it was a tetragonal, and that c/a=1.02. In addition, as for reciprocal lattice points resulting from the {204} plane, differently from the first example, it was confirmed that a peak was not divided up and down. In addition, a Curie temperature Tc of the piezoelectric substance was 390° C.

Example 3

Fabrication sequence of a piezoelectric substance and a piezoelectric element of a third example is as follows.

After performing hydrofluoric acid processing of a Si(100) substrate surface, a 100-nm-thick Y-doped ZrO$_2$ film was formed at a substrate temperature of 800° C. by the sputtering method, and then, a 60-nm-thick CeO$_2$ film was formed at a substrate temperature of 600° C. Both were single crystal films of <100> orientation. Further, a 100-nm-thick LaNiO$_3$ (LNO) film was formed on this at a substrate temperature of 300° C. as a lower electrode film by the sputtering method. Furthermore, a 200-nm-thick SrRuO$_3$ (SRO) film was formed at a substrate temperature of 600° C. on this LNO film, and the substrate which had a lower electrode film and the like was obtained. The electrode film and SRO film were single crystal films of <100> orientation.

The above-mentioned substrate was used instead of the La-doped SrTiO$_3$ {100} substrate, and the following was used as a target. As a target, a material whose main component was PZT whose target density was 88%, and in which the element ratio {Pb/(Zr+Ti)} Target of Pb, Zr, and Ti of a target was 1.00 and {Zr/(Zr+Ti)} Target was 0.75 was used. The piezoelectric substance and piezoelectric element of the third example were produced under the same conditions as those in the first example except using these. According to the ICP composition analysis, as for element ratios of Pb, Zr, and Ti of the piezoelectric substance, Pb/(Zr+Ti) was 1.45 and Zr/(Zr+Ti) was 0.65. In addition, according to the 2θ/θ measurement of the X-ray diffraction, only a reflection peak resulting from the {00L} plane (L=1, 2, 3 . . . , n: n is an integer) of the perovskite structure of PZT was detected. When the positive pole measurement of an asymmetric plane {202} was performed, reflection peaks appeared in fourfold symmetry. Consequently, it was confirmed that the piezoelectric substance was a single crystal PZT film with the perovskite type structure of <100> orientation. Similarly, according to the reciprocal lattice mapping of {004} and {204} by the X-ray diffraction, it was confirmed that lattice constants of this single crystal film were a=4.09 Å, c=4.13 Å, and β=89.5°, that it was a monoclinic, and that c/a=1.01. In addition, as for reciprocal lattice points resulting from the {204} plane, peaks were divided up and down, and hence, it was confirmed that monoclinics had relation of a twin crystal. In addition, a Curie temperature Tc of the piezoelectric substance was 520° C.

Example 4

Fabrication sequence of a piezoelectric substance and a piezoelectric element of a fourth example is as follows.

After a 4-nm-thick $TiO_2$ film was formed on a Si substrate on which a 100-nm thick $SiO_2$ layer which was a thermal oxidation film was formed, a 100-nm-thick Pt film was formed by the sputtering method at a substrate temperature of 200° C. The Pt film was a <111> orientation film. Further, a 100-nm-thick $LaNiO_3$ (LNO) film was formed on this at a substrate temperature of 300° C. as a lower electrode film by the sputtering method. Furthermore, a 200-nm-thick $SrRuO_3$ (SRO) film was formed at a substrate temperature of 600° C. on this LNO film, and the substrate which had a lower electrode film and the like was obtained. The electrode film and SRO film were uniaxial crystal films of <100> orientation.

Next, the piezoelectric substance and piezoelectric element of the fourth example were produced under the same conditions as those in the third example except using the above-mentioned substrate which had the lower electrode film and the like. According to the ICP composition analysis, as for element ratios of Pb, Zr, and Ti of the piezoelectric substance, Pb/(Zr+Ti) was 1.35 and Zr/(Zr+Ti) was 0.63. In addition, according to the 2θ/θ measurement of the X-ray diffraction, only a reflection peak resulting from the {00L} plane (L=1, 2, 3 . . . , n: n is an integer) of the perovskite structure of PZT was detected. When the positive pole measurement of an asymmetric plane {202} was performed, ring-like peaks appeared. Consequently, it was confirmed that the piezoelectric substance was a uniaxial orientation PZT film with the perovskite type structure of <100> orientation. Similarly, according to the reciprocal lattice mapping of {004} and {204} by the X-ray diffraction, it was confirmed that lattice constants of this uniaxial orientation film were a=4.08 Å, c=4.14 Å, and β=89.0°, that it was a monoclinic, and that c/a=1.01. In addition, a Curie temperature Tc of the piezoelectric substance was 520° C.

Comparative Example 2

A piezoelectric substance and a piezoelectric element of a second comparative example were produced in the following procedure.

As a target, a material whose main component was PZT whose target density was 98%, and in which the element ratio {Pb/(Zr+Ti)} Target of Pb, Zr, and Ti of a target was 1.05 and {Zr/(Zr+Ti)} Target was 0.45 was used. The piezoelectric substance and piezoelectric element of the second comparative example were produced under the same conditions as those in the third example except using the above-mentioned target. According to the ICP composition analysis, as for element ratios of Pb, Zr, and Ti of the piezoelectric substance, Pb/(Zr+Ti) was 1.02 and Zr/(Zr+Ti) was 0.45. In addition, according to the 2θ/θ measurement of the X-ray diffraction, only a reflection peak resulting from the {00L} plane (L=1, 2, 3 . . . , n: n is an integer) of the perovskite structure of PZT was detected. When the positive pole measurement of an asymmetric plane {202} was performed, reflection peaks appeared in fourfold symmetry. Consequently, it was confirmed that the piezoelectric substance was a single crystal PZT film with the perovskite type structure of <100> orientation. Similarly, according to the reciprocal lattice mapping of {004} and {204} by the X-ray diffraction, it was confirmed that lattice constants of this single crystal film were a=4.04 Å, c=4.17 Å, and β=90°, that it was a tetragonal, and that c/a=1.03. In addition, a Curie temperature Tc of the piezoelectric substance was 410° C.

Comparison of measurement result of piezoelectric constant and leakage current in above-described example Table 1 shows measurement results of the piezoelectric constant and the leakage current of the piezoelectric elements of the first to fourth examples, and the first and second comparative examples. Here, the piezoelectric constant was evaluated by processing the upper electrode into φ100-μm pattern, and measuring the piezoelectric constant in a d33 mode which measured minute displacement with a scanning probe microscopy (SPM) at the time of applying a voltage between the upper and lower electrodes. In addition, the leakage current was evaluated by processing the upper electrode into φ100-μm pattern similarly to the piezoelectric constant measurement and measuring a leakage current between the upper and lower electrodes at the time of applying a DC voltage of 100V between the upper and lower electrodes.

TABLE 1

|  | Example 1 | Example 2 | Example 3 | Example 4 | Comparative example 1 | Comparative example 2 |
| --- | --- | --- | --- | --- | --- | --- |
| Piezoelectric Constant (pC/N) (pC/N) | 350 | 300 | 330 | 320 | 300 | 180 |
| Leakage Current (A/cm$^2$) | $3.5 \times 10^{-7}$ | $1.2 \times 10^{-7}$ | $4.7 \times 10^{-6}$ | $3.5 \times 10^{-6}$ | $2.2 \times 10^{-3}$ | $6.5 \times 10^{-6}$ |

As shown in Table 1, although the first and second examples have an equal or larger piezoelectric constant in comparison with the first comparative example, the leakage current is suppressed low. In addition, it is possible to confirm that the third and fourth examples have the large piezoelectric constant in comparison with the second comparative example, and the leakage current is also suppressed.

Example 5 and Comparative Example 3

Next, liquid discharge heads of a fifth example and a third comparative example were produced in the following procedures.

An SOI substrate on which a 500 nm-thick epitaxial Si film and a 500-nm-thicken $SiO_2$ layer were formed was used. A piezoelectric element was produced under the similiar conditions as those in the third example or the comparative example 2. After patterning an actuator portion, a vibrating plate and an individual liquid chamber were formed by dry-etching the Si substrate, which was a handle layer, by the inductively coupled plasma method (ICP method). Next, another Si substrate on which a common liquid chamber and a communication hole were formed on this was bonded together. Further, by bonding a substrate, in which a discharge port was formed, to the above-mentioned Si substrate on which the common liquid chamber and communication hole were formed, a liquid discharge head where the vibrating plate was constructed of the $SiO_2$ layer, Si film, Y-doped $ZrO_2$ film, and $CeO_2$ film was produced. The liquid discharge head whose piezoelectric element was produced similarly to the third example was made a liquid discharge head of the fifth example, and the liquid discharge head whose piezoelectric element was produced similarly to the second comparative example was made a liquid discharge head of the third comparative example. A drive signal was applied to and drove these liquid discharge heads, a φ20-μm laser beam was radiated on a center portion of the individual liquid chamber of the liquid discharge head from an upper electrode side, and a displacement amount of the liquid discharge head was evaluated by a laser Doppler displacement system. Although the liquid discharge head of the fifth example showed displacement with good followability also to $10^8$ times of drive signals, the liquid discharge head of the third comparative example not only had a small displacement amount, but also showed attenuation of displacement by $10^5$ times.

Example 6

In regard to the piezoelectric substance formed as a film, this example, where lead was decreased in the range of this embodiment in comparison with the first example, was available preferably. Explanation of portions the same as those in the first example will be omitted.

On a La-doped $SrTiO_3${100} substrate which served as a lower electrode, a 3-μm film thickness of piezoelectric substance PZT was formed as a film with holding a substrate temperature of 600° C. by the sputtering method. A material whose main component was PZT whose target density was 88% was used as a target. The element ratio {Pb/(Zr+Ti)}Target of the target was made 0.85, and {Zr/(Zr+Ti)} Target was made 0.85. Sputtering was performed under the conditions of sputtering gas: $Ar/O_2$=20/1, sputtering power: 1.6 W/cm², and sputtering gas pressure: 0.1 Pa. At this time, when a 3-μm film was formed with holding a substrate temperature at 620° C., Pb/(Zr+Ti) was 1.10, and Zr/(Zr+Ti) was 0.75. The piezoelectric substance was a single crystal film with the PZT perovskite type structure of <100> orientation, its lattice constants were a=4.09, c=4.12 Å, and β=89.0°, it was a monoclinic, and c/a=1.007 held. In addition, temperature dependency of a dielectric constant of the piezoelectric substance was the maximum at 540° C., and a Curie temperature Tc was 540° C.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2005-241396, filed Aug. 23, 2005, which is hereby incorporated by reference herein in its entirety.

What is claimed is:

1. A piezoelectric substance, wherein a main component of the piezoelectric substance is PZT which has a perovskite type structure expressed as $Pb(Zr_xTi_{1-x})O_3$, x expresses an element ratio Zr/(Zr+Ti) of Zr and Ti,
an element ratio Pb/(Zr+Ti) of Pb, Zr, and Ti of the piezoelectric substance is 1.05 or more,
an element ratio Zr/(Zr+Ti) of Zr and Ti is 0.5 to 0.8 inclusive, and
the piezoelectric substance has at least a perovskite type structure of a monoclinic system.

2. The piezoelectric substance according to claim 1, wherein a Curie temperature Tc of the piezoelectric substance and a Curie temperature $Tc_0$ in bulk at the element ratio of Zr and Ti of the piezoelectric substance satisfy a relation of $Tc>Tc_0+50°$ C.

3. The piezoelectric substance according to claim 1, wherein a film thickness of the piezoelectric substance is 1 to 10 μm inclusive.

4. The piezoelectric substance according to claim 1, wherein lattice constants a and c of the piezoelectric substance satisfy a relation of 1.005<c/a<1.05.

5. The piezoelectric substance according to claim 1, wherein the piezoelectric substance is a uniaxial crystal or a single crystal.

6. The piezoelectric substance according to claim 5, wherein the piezoelectric substance has <100> orientation.

7. A piezoelectric element which has a pair of electrodes and a piezoelectric substance, wherein a main component of the piezoelectric substance is PZT which has a perovskite type structure expressed as $Pb(Zr_xTi_{1-x})O_3$, x expresses an element ratio Zr/(Zr+Ti) of Zr and Ti,
an element ratio Pb/(Zr+Ti) of Pb, Zr, and Ti of the piezoelectric substance is 1.05 or more,
an element ratio Zr/(Zr+Ti) of Zr and Ti is 0.5 to 0.8 inclusive, and
the piezoelectric substance has at least a perovskite type structure of a monoclinic system.

8. The piezoelectric element according to claim 7, wherein at least one of the electrodes includes an electrode made of oxide with perovskite type structure which has <100> orientation.

9. A liquid discharge head which has an individual liquid chamber communicating with a discharge port, and a piezoelectric element which is provided in correspondence with the individual liquid chamber, and which includes a piezoelectric substance having a pair of electrodes, and discharges liquid in the individual liquid chamber from the discharge port, wherein a main component of the piezoelectric substance is PZT which has a perovskite type structure expressed as $Pb(Zr_xTi_{1-x})O_3$, x expresses an element ratio Zr/(Zr+Ti) of Zr and Ti,
an element ratio Pb/(Zr+Ti) of Pb, Zr, and Ti of the piezoelectric substance is 1.05 or more, and
an element ratio Zr/(Zr+Ti) of Zr and Ti is 0.5 to 0.8 inclusive, and the piezoelectric substance has at least a perovskite type structure of a monoclinic system.

10. A liquid discharge apparatus which has a liquid discharge head which discharges liquid, wherein a piezoelectric element which generates energy for discharging liquid has a piezoelectric substance and a pair of electrodes, and wherein a main component of the piezoelectric substance is PZT which has a perovskite type structure expressed as $Pb(Zr_x Ti_{1-x})O_3$, x expresses an element ratio $Zr/(Zr+Ti)$ of Zr and Ti, an element ratio $Pb/(Zr+Ti)$ of Pb, Zr, and Ti of the piezoelectric substance is 1.05 or more, an element ratio $Zr/(Zr+Ti)$ of Zr and Ti is 0.5 to 0.8 inclusive, and the piezoelectric substance has at least a perovskite type structure of a monoclinic system.

* * * * *